US012804282B2

(12) United States Patent
Eom et al.

(10) Patent No.: US 12,804,282 B2
(45) Date of Patent: Nov. 17, 2026

(54) IMAGE SENSOR

(71) Applicant: Samsung Electronics Co., Ltd., Suwon-si (KR)

(72) Inventors: Jaeha Eom, Suwon-si (KR); Sangwoo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 19/211,174

(22) Filed: May 17, 2025

(65) Prior Publication Data

US 2026/0052323 A1 Feb. 19, 2026

(30) Foreign Application Priority Data

Aug. 13, 2024 (KR) ........................ 10-2024-0108554

(51) Int. Cl.

*H04N 25/709* (2023.01)
*H04N 23/667* (2023.01)
*H04N 25/13* (2023.01)
*H10F 39/00* (2025.01)

(52) U.S. Cl.

CPC ......... *H04N 25/709* (2023.01); *H04N 23/667* (2023.01); *H04N 25/134* (2023.01); *H10F 39/809* (2025.01); *H10F 39/811* (2025.01)

(58) Field of Classification Search

CPC .. H04N 25/709; H04N 23/667; H04N 25/134; H04N 25/78; H04N 25/766; H04N 25/77; H04N 25/11; H04N 25/44; H10F 39/809; H10F 39/811; H10F 39/182; H10F 39/813; H10F 39/8037

See application file for complete search history.

(56) References Cited

U.S. PATENT DOCUMENTS

| | | | | |
|---|---|---|---|---|
| 2009/0002536 | A1 | 1/2009 | Nakamura et al. | |
| 2010/0053389 | A1 * | 3/2010 | Matsuura | H04N 25/57 348/294 |
| 2010/0103302 | A1 | 4/2010 | Kondo | |
| 2015/0357369 | A1 * | 12/2015 | Kobayashi | H04N 25/60 250/208.1 |
| 2016/0037115 | A1 | 2/2016 | Tate | |
| 2016/0249002 | A1 * | 8/2016 | Kim | H04N 25/583 |
| 2016/0295143 | A1 | 10/2016 | Park et al. | |
| 2017/0302869 | A1 * | 10/2017 | Ikuma | H04N 25/67 |
| 2019/0260955 | A1 | 8/2019 | Kim et al. | |
| 2020/0058690 | A1 * | 2/2020 | Kim | H04N 25/767 |
| 2020/0260031 | A1 | 8/2020 | Ebihara et al. | |

(Continued)

*Primary Examiner* — Abdelaaziz Tissire

(74) *Attorney, Agent, or Firm* — Muir Patent Law, PLLC

(57) ABSTRACT

An image sensor includes a pixel array including a plurality of pixels arranged in rows and columns, the plurality of pixels configured to output pixel signals to output lines, pixel load circuits, and switch circuits connecting the pixel load circuits to the output lines. The pixel load circuits are connected to the output lines through the switch circuits. Each of the pixel load circuits may include a first transistor and a second transistor connected in series and a first control switch connecting a first node between the first transistor and the second transistor to a ground node, a first aspect ratio of the first transistor and a second aspect ratio of the second transistor may be different from each other, and a first gate node of the first transistor and a second gate node of the second transistor may be connected to the same node.

20 Claims, 17 Drawing Sheets

(56) References Cited

U.S. PATENT DOCUMENTS

| | | | | |
|---|---|---|---|---|
| 2021/0021774 | A1* | 1/2021 | Ebihara | H04N 25/778 |
| 2022/0303485 | A1* | 9/2022 | Kobayashi | H04N 25/00 |
| 2023/0011310 | A1 | 1/2023 | Kim et al. | |
| 2023/0057499 | A1* | 2/2023 | Sankaranarayanan | H03F 3/195 |
| 2023/0326940 | A1* | 10/2023 | Matsuura | H04N 25/709 |
| 2024/0323563 | A1* | 9/2024 | Kobayashi | H04N 25/767 |
| 2025/0365522 | A1* | 11/2025 | Kobayashi | H04N 25/78 |

* cited by examiner

IMAGE SENSOR

CROSS-REFERENCE TO RELATED APPLICATION(S)

This U.S. non-provisional application claims priority under 35 USC § 119 to Korean Patent Application No. 10-2024-0108554, filed on Aug. 13, 2024, in the Korean Intellectual Property Office, the disclosure of which is herein incorporated by reference in its entirety.

BACKGROUND

Example embodiments relate to a complementary metal oxide semiconductor (CMOS) image sensor.

Image sensors are devices that convert optical signals into electrical signals.

An image sensor may include a pixel array, including a plurality of pixels, and a logic circuit that generates image data from pixel signals output from the pixel array. Nowadays, as the plurality of pixels are increased, the number of additional bias circuits may be needed and power consumption may be increased. Therefore, it is useful to reduce the power consumption without increasing the number of additional bias circuits.

SUMMARY

Example embodiments provide an image sensor reducing power consumption and circuit complexity.

According to an example embodiment, an image sensor includes a pixel array including a plurality of pixels arranged in rows and columns, the plurality of pixels configured to output pixel signals to output lines, pixel load circuits, and switch circuits connecting the pixel load circuits to the output lines. The pixel load circuits are connected to the output lines through the switch circuits. Each of the pixel load circuits may include a first transistor and a second transistor connected in series and a first control switch connecting a first node between the first transistor and the second transistor to a ground node, a first aspect ratio of the first transistor and a second aspect ratio of the second transistor may be different from each other, and a first gate node of the first transistor and a second gate node of the second transistor may be connected to the same node.

According to an example embodiment, an image sensor includes a plurality of output lines extending in a first direction, a plurality of pixels configured to output pixel signals to the plurality of output lines, a plurality of pixel load circuits, a switch circuit connecting one of the plurality of pixel load circuits to one of the plurality of output lines, and a plurality of bias circuits configured to supply a bias voltage to each of the plurality of pixel load circuits. Each of the plurality of pixel load circuits may include a plurality of transistors connected in series and a control switch connecting a first node between a first transistor and a second transistor, among the plurality of transistors, to a ground node. Gate nodes of the first transistor and the second transistor may be connected to the same node, and aspect ratios of the first transistor and the second transistor may be different from each other. Each of the plurality of bias circuits may output the bias voltage of the same magnitude.

According to an example embodiment, an image sensor includes a plurality of output lines extending in a first direction, a plurality of pixels configured to output pixel signals to the plurality of output lines, a plurality of pixel load circuits, and a plurality of switch circuits each connecting one of the plurality of pixel load circuits to one of the plurality of output lines. Each of the plurality of pixel load circuits may include a plurality of transistors connected in series and a control switch connecting a first node between a first transistor and a second transistor, among the plurality of transistors, to a ground node. Gate nodes of the first transistor and the second transistor may be connected to the same node, and aspect ratios of the first transistor and the second transistor may be different from each other. The plurality of pixel load circuits may include a first pixel load circuit electrically connected to a driven output line, among the plurality of output lines, through a first switch circuit among the plurality of switch circuits, a second pixel load circuit electrically connected to a non-driven output line, among the plurality of output lines, through a second switch circuit, and the control switches of the first pixel load circuit and the second pixel load circuit may have different operating states from each other.

DETAILED DESCRIPTION

Hereinafter, example embodiments will be described with reference to the accompanying drawings.

Figure 1:
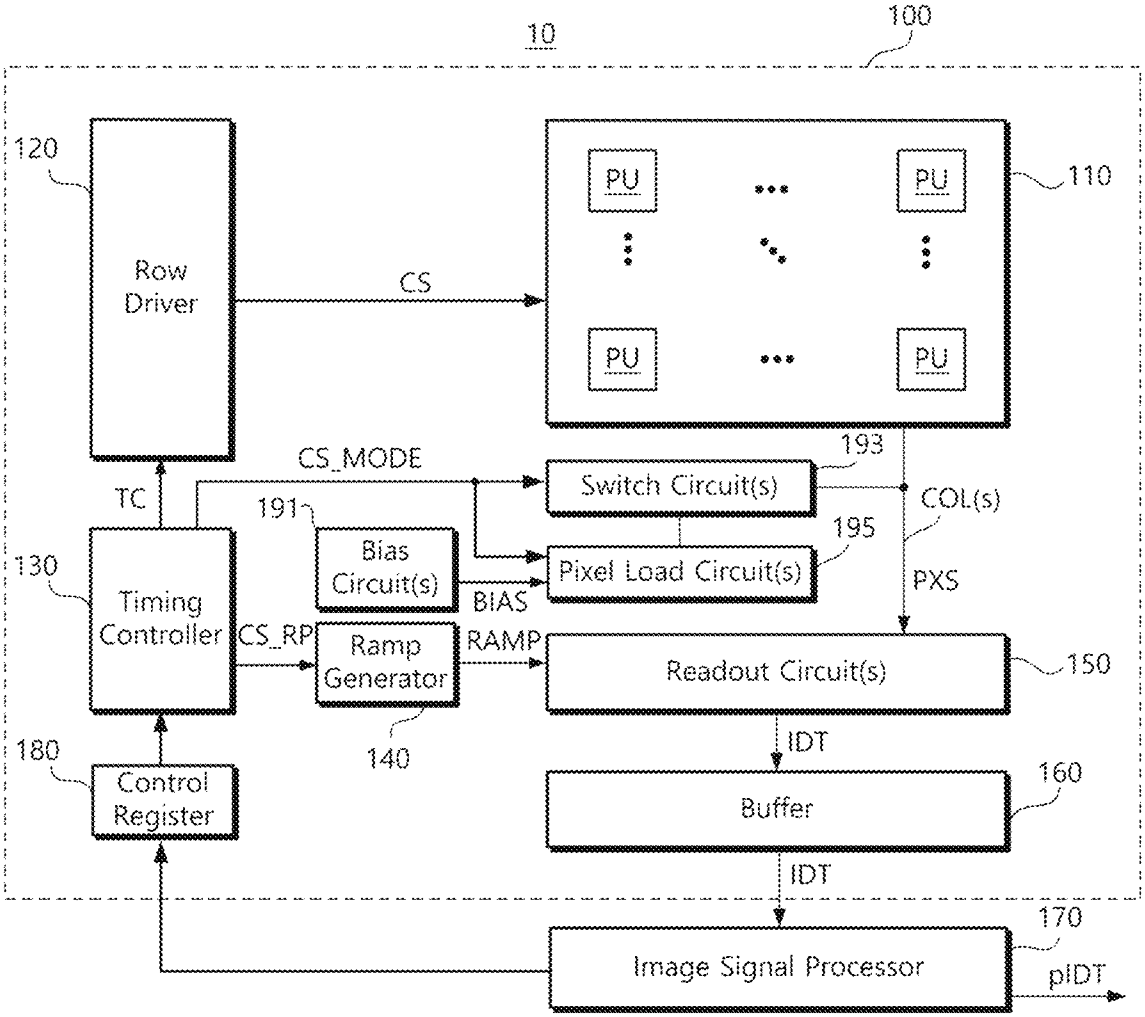
FIG. 1 is a block diagram illustrating an image sensing device according to an example embodiment.

FIG. 1 is a block diagram illustrating an image sensing device 10 according to an example embodiment. The image sensing device 10 according to an example embodiment will be described in detail with reference to FIG. 1.

The image sensing device 10 may include an image sensor 100 and an image signal processor 170.

The image sensor 100 generates image data, visual information of an object captured through a lens, and the image signal processor 170 may process an image signal provided from a readout circuit 150 through a buffer 160. The processed image signal may be transmitted to an external display device and/or an external storage device through an output interface.

The image sensor 100 may include a pixel array 110, a row driver 120, a timing controller 130, a ramp signal generator 140, the readout circuit 150, the buffer 160, a control register 180, a bias circuit 191, a switch circuit 193, and a pixel load circuit 195. The readout circuit 150 may include an analog-to-digital converter (ADC) and an output buffer.

The pixel array 110 includes a plurality of pixel units PUs.

The pixel array 110 may receive a plurality of pixel driving signals CS, such as a select signal controlling a select transistor, a reset signal controlling a reset transistor, and a transfer transistor control signal controlling a transfer transistor, from the row driver 120.

Each of the plurality of pixel units PUs of the pixel array 110 operates under the control of the pixel driving signals CS received from the row driver 120. For example, pixel circuits (the select transistor, the reset transistor, the transfer transistor, or the like) included in each of the pixel units PUs may operate under the control of the pixel driving signals CS received from the row driver 120.

For example, the plurality of pixel units PUs may be arranged in a matrix. Each of the pixel units PUs may be electrically connected to a row line and an output line.

According to an embodiment, each pixel unit PU may include a single photodiode or a plurality of photodiodes.

In an example embodiment, each pixel unit PU may include a single pixel, and each pixel may include a single photodiode.

In an example embodiment, each pixel unit PU is based on a multi-pixel structure, and each pixel unit PU may include a plurality of pixels. The pixels included in each pixel unit PU may be referred to as sub-pixels. Each sub-pixel may include a photodiode. A plurality of sub-pixels included in the same pixel unit PU may be electrically connected in common to the same row line and the same output line.

In an example embodiment, a pixel unit PU based on a multi-pixel structure may share at least a portion of the pixel circuits between the plurality of sub-pixels.

For example, each pixel unit PU may include a plurality of transistors controlled by the row driver 120. The sub-pixels included in the same pixel unit PU may share at least a portion of a driving transistor, a select transistor, and a reset transistor.

The row driver 120 may drive one or more rows of the pixel array 110 under the control of the timing controller 130. In the present specification, the term "row" refers to a plurality of pixel units PUs arranged in a first direction, among the plurality of pixel units PUs of the pixel array 110. Also, the term "column" refers to a plurality of pixel units PUs arranged in a second direction, among the plurality of pixel units PUs included in the pixel array 110.

The row driver 120 may drive at least one row among a plurality of rows. The row driver 120 may generate a select signal to drive at least one of the plurality of rows. The row driver 120 may activate pixel units PUs corresponding to a selected row. A pixel signal PXS of pixel units PUs of the selected row may be transmitted to the readout circuit 150 through a corresponding output line COL among a plurality of output lines COLs.

In an example embodiment, a column may be electrically connected to a single output line or to a plurality of output lines COLs. For example, among the plurality of pixel units PUs in a single column, some pixel units PUs may output a pixel signal PXS to one output line, while other pixel units PUs may output a pixel signal PXS to another output line.

The pixel signal PXS may be a voltage of a floating diffusion region. The pixel signal PXS may be a voltage reflecting charges generated in the photodiodes included in the plurality of pixel units PUs. Alternatively, the pixel signal PXS may be a reference voltage used to perform correlated double sampling (CDS) with the voltage reflecting the charges generated in the photodiodes. The reference voltage may be a voltage of a floating diffusion region. For example, the reference voltage may be a voltage of a floating diffusion region reset by a reset voltage.

The timing controller 130 may control the pixel array 110, the row driver 120, the ramp signal generator 140, and the readout circuit 150. The timing controller 130 may provide a timing control signal TC to the row driver 120.

The timing control signal TC may be set to be different based on the operation mode of the image sensor 100. For example, the image sensor 100 may have different operation modes based on a structure of the pixel unit PU.

For example, when a pixel unit PU has a multi-pixel structure, sub-pixels included in the same pixel unit PU may correspond to color filters of the same color. The timing control signal TC may be set to operate in binning mode in which the pixel units PUs merge and output pixel signals of sub-pixels included in the same pixel unit PU.

The operation mode of the image sensor 100 may be selected by a user, set under the control of an external processor, or set under the control of the image signal processor 170.

In an example embodiment, the image signal processor 170 may be implemented as a single package together with the image sensor 100. Alternatively, the image signal processor 170 may be disposed in an external device to the image sensor 100.

The row driver 120 may drive each of the plurality of pixels PXs in either normal imaging mode or high dynamic range (HDR) imaging mode, based on the timing control signal TC.

The timing controller 130 may control the ramp signal generator 140 through a ramp control signal CS_RP. The ramp control signal CS_RP may include a ramp enable signal, a mode signal, or the like.

The control register 180 may receive a control signal from the image signal processor 170 and control the timing controller 130 based on the received control signal. The control register 180 may store register values based on the operation mode of the image sensor 100.

The ramp signal generator 140 may generate a ramp signal RAMP corresponding to the ramp control signal CS_RP. The ramp signal generator 140 may generate the ramp signal RAMP having a predetermined slope. The ramp signal generator 140 may provide the generated ramp signal RAMP to the analog-to-digital converter (ADC) of the readout circuit 150.

The ADC of the readout circuit 150 may output an image signal IDT, a digital signal, based on the ramp signal RAMP and the pixel signal. For example, the ADC may convert the pixel signal PXS into the image signal IDT based on the ramp signal RAMP using correlated double sampling, and output the image signal IDT. The image signal IDT may be provided to the image signal processor 170 through the buffer 160.

The image signal processor 170 may perform various image signal processing, such as demosaicing, on the image signal IDT.

In an example embodiment, the image signal processor 170 may output a processed image signal pIDT to an external device through an output interface circuit, not illustrated. In an example embodiment, when the image signal processor 170 is disposed in an external device, the buffer 160 may output the image signal IDT to the external image signal processor 170 through the output interface circuit, not illustrated.

Each of the output lines COLs of the image sensor 100 according to an example embodiment may be electrically connected to a pixel load circuit 195. The pixel load circuit 195 may be electrically connected to the output line COL through the switch circuit 193.

The pixel load circuit 195 may receive a bias voltage BIAS from the bias circuit 191. The pixel load circuit 195 may maintain an ON state during a readout operation of the pixel units PUs, based on the bias voltage BIAS. Accordingly, the pixel load circuit 195 may be controlled such that a constant magnitude of bias current flows through the electrically connected output line COL. Also, the pixel load circuit 195 maintains an ON state, so that noise components caused by changes in turn-on and turn-off operations of the pixel load circuit 195 may be reduced.

Each of the bias circuit 191, the switch circuit 193, and the pixel load circuit 195 may be provided in a plurality of instances. Each of the plurality of switch circuits 193 may have the same structure. Each of the pixel load circuits 195 may have the same structure. Each of the plurality of bias circuits 191 may have the same structure. Each of the plurality of bias circuits 191 may provide the same magnitude of bias voltage to each corresponding pixel load circuit 195.

For example, the image sensor 100 may include n output lines COLs (where n is a positive integer greater than or equal to 1) through which a pixel signal PXS is output. Each of the n output lines COLs may be electrically connected to each corresponding n pixel load circuits 195 through the switch circuit 193. Each of the n pixel load circuits 195 may receive the same magnitude of bias voltage from each corresponding n bias circuit 191.

The plurality of pixel load circuits 195 may be controlled in the same manner according to an embodiment, or may be controlled in different ways based on the corresponding output line COL. For example, the magnitude of a first current controlled to flow through an output line COL corresponding to one of the plurality of pixel load circuits 195 may be smaller than the magnitude of a second current controlled to flow through an output line COL corresponding to another pixel load circuit 195.

In an example embodiment, when a single column is connected to a plurality of output lines COLs, all of the output lines COLs connected to the single column may output a pixel signal PXS in the same time period, depending on an operation method.

In an example embodiment, when a single column is connected to a plurality of output lines COLs, at least a portion of the output lines COLs connected to the single column may output a pixel signal PXS in different time periods, depending on the operation method. For example, among the plurality of output lines COLs connected to one column, one output line may output a pixel signal PXS in a first time period and another output line may output a pixel signal PXS in a second time period. An operation of reading out the pixel signals PXS of all the pixel units PUs of the pixel array 110 may require more time than a readout operation in which all of the output lines COLs connected to one column output a pixel signal PXS in the same time period. Thus, a frame rate may be reduced.

The pixel load circuit 195 may be controlled such that a small magnitude of bias current flows through the output line COL while a corresponding output line COL does not output a pixel signal PXS. For example, the pixel load circuit 195 may be controlled such that a smaller magnitude of current flows through a non-driven output line COL than through a driven output line COL to prevent the non-driven output line COL from floating. For example, the second output line COL may not output a pixel signal PXS while the first output line COL outputs a pixel signal PXS. The magnitude of a first current controlled by a first pixel load circuit 195 electrically connected to the first output line COL may be smaller than the magnitude of a second current controlled by a second pixel load circuit 195 electrically connected to the second output line COL.

Although the magnitudes of currents controlled by the plurality of pixel load circuits 195 are different from each other, the magnitudes of bias voltage supplied to the plurality of pixel load circuits 195 according to an example embodiment may be the same. Although the plurality of pixel load circuits 195 have the same configuration, the plurality of pixel load circuits 195 may be controlled in different ways to allow different magnitudes of bias current to flow through the corresponding output line COL.

Accordingly, the image sensor 100 may not include different bias circuits supplying different magnitudes of bias voltage. The bias circuits 191, supplying a bias voltage to each of the plurality of pixel load circuits 195, may include a constant current source having the same structure and supplying the same magnitude of current. For example, even with only the bias circuits 191 supplying the same magnitude of bias voltage, different magnitudes of bias current may stably flow to both an output line COL that outputs the pixel signal PXS and an output line COL that does not output the pixel signal PXS.

The image sensor 100 may reduce power consumption by controlling the pixel load circuit 195 connected to a non-driven output line, among the output lines COLs connected to the pixel units PUs, such that a small magnitude of current flows.

In addition, the image sensor 100 does not need an additional bias circuit supplying a small magnitude of bias voltage to each of the pixel load circuits 195 connected to the output lines COLs connected to the pixel units PUs. As a result, an area occupied by the bias circuits 191 may be reduced. In addition, interconnections for supplying different bias voltages from bias circuits supplying different magnitudes of bias voltage may be reduced. As a result, the complexity and occupied area of a layout caused by the interconnections for supplying bias voltages may be reduced.

Figure 2A:
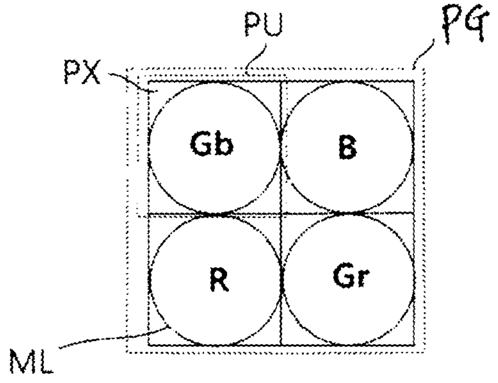
FIG. 2A is a plan view of a pixel unit according to an example embodiment.
Figure 2B:
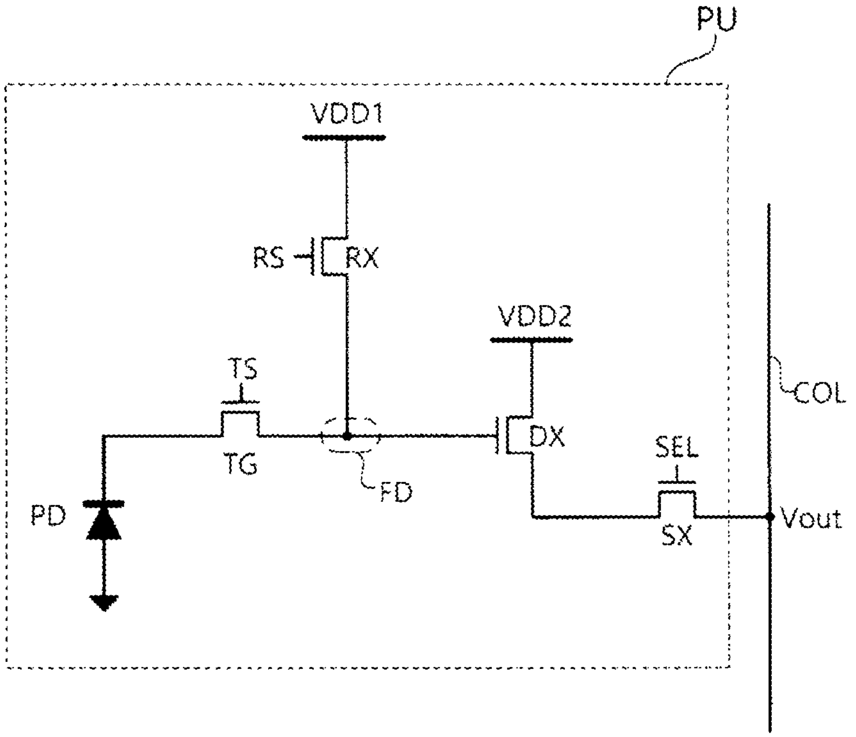
FIG. 2B is a circuit diagram of the pixel unit of FIG. 2A according to an example embodiment.

FIG. 2A is a plan view of a pixel unit according to an example embodiment, and FIG. 2B is a circuit diagram of the pixel unit of FIG. 2A according to an example embodiment. A pixel unit PU of FIGS. 2A and 2B may correspond to the pixel unit PU of FIG. 1.

Referring to FIG. 2A, the pixel unit PU according to an example embodiment may include a single pixel PX, and the pixel PX may include a single photodiode. A plurality of pixels PXs may constitute a pixel group PG.

Some of pixels PXs included in the same pixel group PG may correspond to color filters of the same color, and others may correspond to color filters of different colors. For example, in a pixel group PG having a Bayer color pattern as illustrated in FIG. 2A, four pixels PXs may be included in the pixel group PG. Two pixels PXs may correspond to a green color filter, and the remaining two pixels PXs may correspond to a red color filter and a blue color filter, respectively. According to an example embodiment, the pixel group PG may be based on a color pattern other than the Bayer color pattern. The pixel array 110 of FIG. 1 may include a plurality of pixel groups PGs arranged in a matrix.

Each of the pixels PXs may include an individual microlens ML.

Each of the pixels PXs may output an individual pixel signal.

Referring to FIG. 2A, the pixel PX of the pixel unit PU according to an example embodiment may include a photodiode PD, a transfer gate TG, a floating diffusion region FD, a reset transistor RX, a driving transistor DX, and a select transistor SX. The transfer gate TG, reset transistor RX, driving transistor DX, and select transistor SX may each be controlled by the row driver 120 of FIG. 1.

The photodiode PD may transfer charges, accumulated through the transfer gate TG, to the floating diffusion region FD.

The reset transistor RX may connect a first pixel voltage power supply VDD1 and the floating diffusion region FD, and may be controlled by a reset control signal RS.

The driving transistor DX may be a source follower transistor, and may connect a second pixel voltage power supply VDD2 and the select transistor SX. The second pixel voltage power supply VDD2 may be the same as or different from the first pixel voltage power supply VDD1.

The driving transistor DX may be controlled by the voltage of the floating diffusion region FD. The driving transistor DX may provide an output signal, obtained by amplifying a voltage supplied to a gate terminal, to a source terminal of the select transistor SX.

The select transistor SX may output a pixel signal Vout, provided from the driving transistor DX, to the output line COL based on the control of the select signal SEL. The output line COL of FIG. 2B may correspond to the output line COL of FIG. 1.

FIGS. 3A, 3B, 3C, and 3D are plan views of pixel units according to example embodiments. A pixel unit PU of FIGS. 3A, 3B, 3C, and 3D may correspond to the pixel unit PU of FIG. 1. FIGS. 3A to 3D illustrate an example in which a pixel unit PU includes four pixels PXs. For example, the pixel unit PU may include j×k pixels (where j and k are positive integers greater than or equal to 2). With reference to FIGS. 3A, 3B, 3C, and 3D, a pixel unit PU according to example embodiments will be described. Detailed descriptions that overlap or are similar to the descriptions provided with reference to FIG. 2A will be omitted to avoid unnecessary repetition. The pixel array 110 of FIG. 1 may include pixel units PUs according to any one of FIGS. 3A, 3B, 3C, and 3D arranged in an m×n matrix (where m and n are positive integers greater than or equal to 2).

Figure 3A:
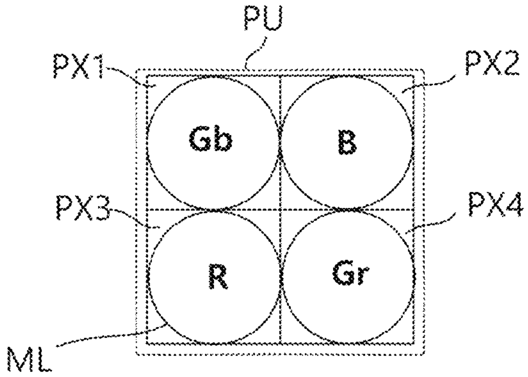
FIGS. 3A, 3B, 3C, and 3D are plan views of pixel units according to example embodiments.

Referring to FIG. 3A, a pixel unit PU according to an example embodiment may include four pixels PX1, PX2, PX3, and PX4, and each of the pixels PX1, PX2, PX3, and PX4 may include at least one photodiode.

Some of the pixels PX1, PX2, PX3, and PX4 included in a single pixel unit PU may correspond to color filters of the same color, and others may correspond to color filters of different colors. For example, the pixels PX1, PX2, PX3, and PX4 may correspond to color filters of a Bayer color pattern as illustrated in FIG. 3A. According to an example embodiment, the pixel unit PU may be based on a color pattern, other than the Bayer color pattern.

Each of the pixels PX1, PX2, PX3, and PX4 may include an individual microlens ML.

Each of the pixels PX1, PX2, PX3, and PX4 may output an individual pixel signal.

In an example embodiment, the pixels PX1, PX2, PX3, and PX4 included in the same pixel unit PU may share some pixel circuits. Alternatively, each of the pixels PX1, PX2, PX3, and PX4 may not share pixel circuits as illustrated in FIG. 2B.

Figure 3B:
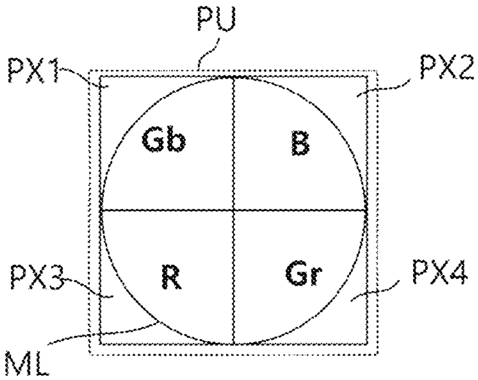

Referring to FIG. 3B, a pixel unit PU according to an example embodiment may include four pixels PX1, PX2, PX3, and PX4, and each of the pixels PX1, PX2, PX3, and PX4 may include at least one photodiode.

Unlike the pixel unit PU of FIG. 3A, the pixels PX1, PX2, PX3, and PX4 of the pixel unit PU of FIG. 3B may include a single microlens ML.

Each of the pixels PX1, PX2, PX3, and PX4 may output an individual pixel signal.

In an example embodiment, the pixels PX1, PX2, PX3, and PX4 included in the same pixel unit PU may share some pixel circuits. Alternatively, each of the pixels PX1, PX2, PX3, and PX4 may not share pixel circuits as illustrated in FIG. 2B.

Figure 3C:
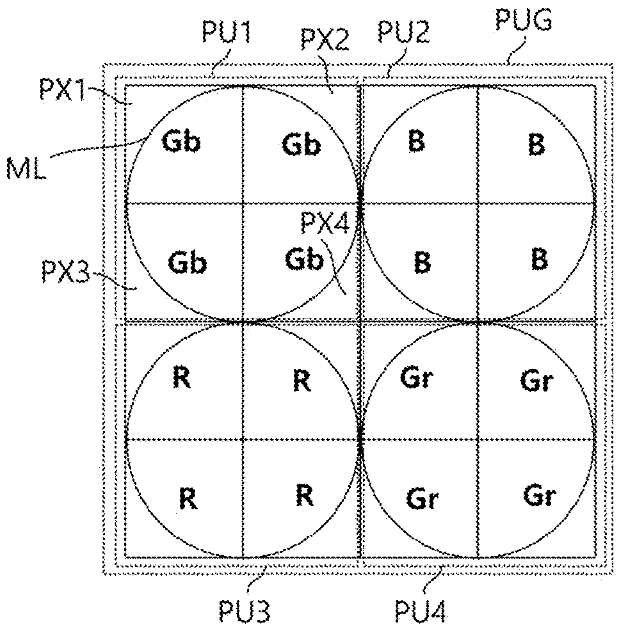

Referring to FIG. 3C, each of the pixel units PU1, PU2, PU3, and PU4 according to an example embodiment includes four pixels PX1, PX2, PX3, and PX4, and each of the pixels PX1, PX2, PX3, and PX4 may include at least one photodiode. The pixel units PU1, PU2, PU3, and PU4 may constitute a pixel unit group PUG.

The pixel array 110 of FIG. 1 may include a plurality of pixel unit groups PUGs arranged in a matrix.

Some of the pixel units PU1, PU2, PU3, and PU4 included in the pixel unit group PUG may correspond to color filters of the same color, and others may correspond to color filters of different colors. For example, the pixel units PU1, PU2, PU3, and PU4 may correspond to color filters of a Bayer color pattern as illustrated in FIG. 3C. According to an example embodiment, the pixel units PU1, PU2, PU3, and PU4 may be based on a color pattern, other than the Bayer color pattern.

Each of the pixel units PU1, PU2, PU3, and PU4 may include an individual microlens ML. The pixels PX1, PX2, PX3, and PX4 included in each of the pixel units PU1, PU2, PU3, and PU4 may share a single microlens ML.

In an example embodiment, each of the pixels PX1, PX2, PX3, and PX4 may output an individual pixel signal or output a pixel signal for each pixel unit, depending on an operation mode. For example, each of the pixels PX1, PX2, PX3, and PX4 included in the same pixel unit may output a pixel signal in different time periods or at the same time.

In an example embodiment, the pixels PX1, PX2, PX3, and PX4 included in the same pixel unit PU may share some pixel circuits. Alternatively, each of the pixels PX1, PX2, PX3, and PX4 may not share pixel circuits as illustrated in FIG. 2B.

Figure 3D:
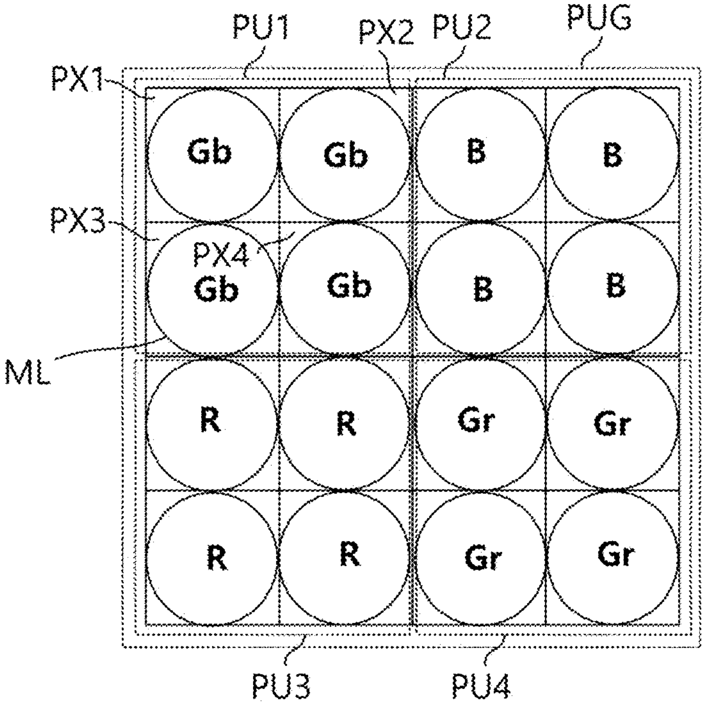

Referring to FIG. 3D, each of the pixel units PU1, PU2, PU3, and PU4 according to an example embodiment may include four pixels PX1, PX2, PX3, and PX4, and each of the pixels PX1, PX2, PX3, and PX4 may include at least one photodiode. The pixel units PU1, PU2, PU3, and PU4 may constitute a pixel unit group PUG.

The pixel array 110 of FIG. 1 may include a plurality of pixel unit groups PUGs arranged in a matrix.

Unlike the embodiment of FIG. 3C, each of the pixel units PU1, PU2, PU3, and PU4 of FIG. 3D may include four pixels PX1, PX2, PX3, and PX4, and each of the pixels PX1, PX2, PX3, and PX4 may include an individual microlens ML.

In an example embodiment, each of the pixels PX1, PX2, PX3, and PX4 may output an individual pixel signal or output a pixel signal for each pixel unit, depending on an operation mode. For example, each of the pixels PX1, PX2, PX3, and PX4 included in the same pixel unit may output a pixel signal in different time periods or at the same time.

In an example embodiment, the pixels PX1, PX2, PX3, and PX4 included in the same pixel unit PU may share some pixel circuits. Alternatively, each of the pixels PX1, PX2, PX3, and PX4 may not share pixel circuits as illustrated in FIG. 2B.

Figure 3E:
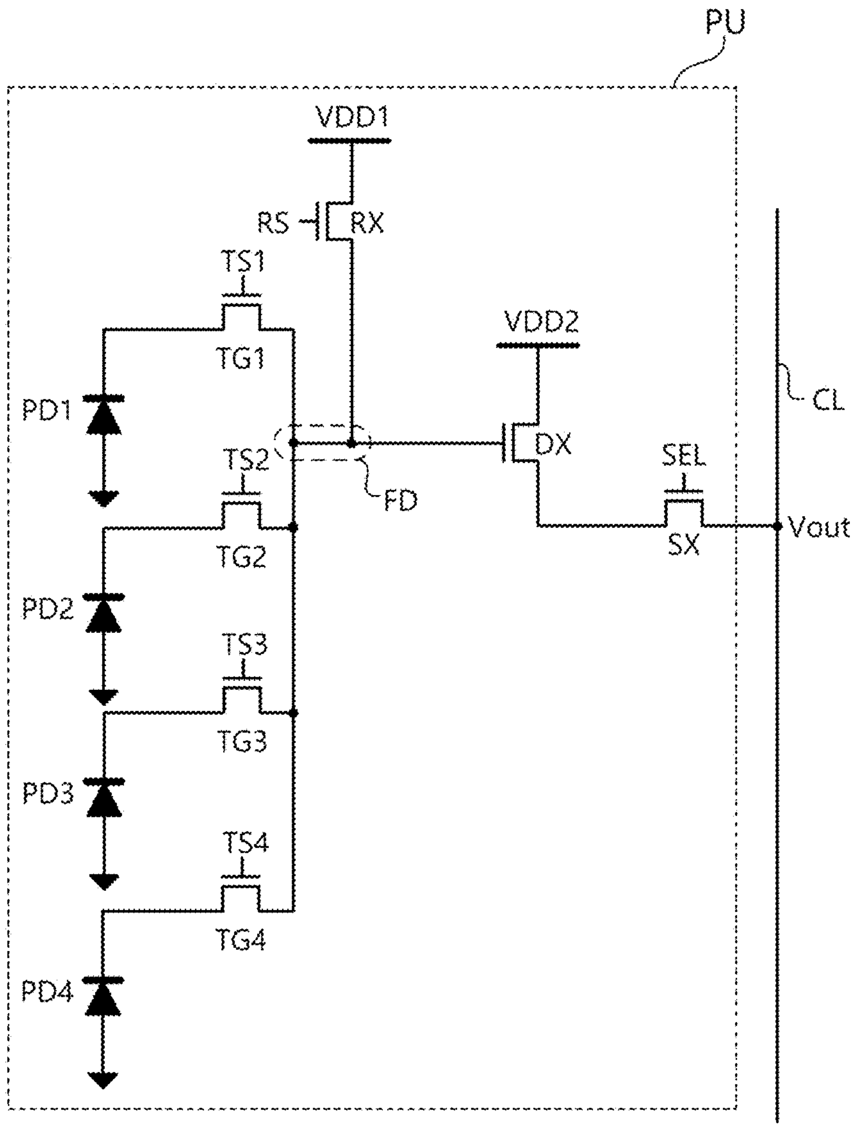
FIG. 3E is a circuit diagram of the pixel units of FIGS. 3A to 3D according to an example embodiment.

FIG. 3E is a circuit diagram of the pixel unit PU according to the embodiments of FIGS. 3A to 3D. FIG. 3E illustrates an example in which the pixels PX1, PX2, PX3, and PX4 included in the pixel unit PU share some pixel circuits. Detailed descriptions that overlap or are similar to the descriptions provided with reference to FIG. 2B will be omitted to avoid unnecessary repetition.

Referring to FIG. 3E, the pixel unit PU according to an example embodiment may include first to fourth photodiodes PD1, PD2, PD3, and PD4, first to fourth transfer gates TG1, TG2, TG3, and TG4, a floating diffusion region FD, a reset transistor RX, a driving transistor DX, and a select transistor SX. The first to fourth transfer gates TG1, TG2, TG3, and TG4, the reset transistor RX, the driving transistor DX, and the select transistor SX may each be controlled by the row driver 120 of FIG. 1.

Each of the first to fourth photodiodes PD1, PD2, PD3, and PD4 may transfer charges, accumulated through the corresponding first to fourth transfer gates TG1, TG2, TG3, and TG4, to the floating diffusion region FD. Each of the first to fourth photodiodes PD1, PD2, PD3, and PD4 may transfer charges, accumulated in different time periods, to the floating diffusion region FD. Alternatively, each of the first to fourth photodiodes PD1, PD2, PD3, and PD4 may transfer charges, accumulated at the same time, to the floating diffusion region FD.

The pixels PX1, PX2, PX3, and PX4 included in the same pixel unit PU according to an example embodiment may share the driving transistor DX, the select transistor SX, and the reset transistor RX.

Figure 4:
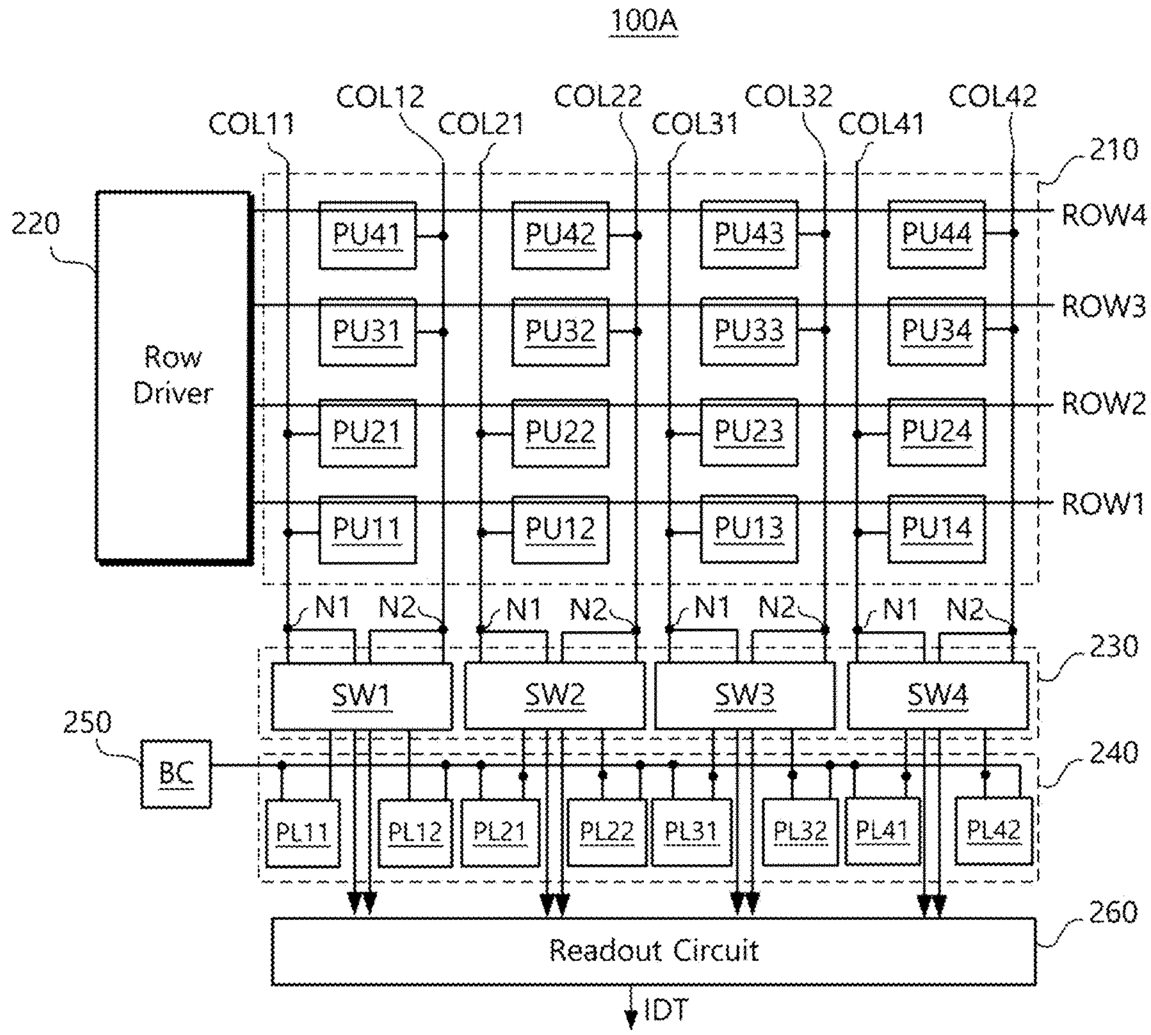
FIG. 4 is a block diagram illustrating a configuration of an image sensor according to an example embodiment.

FIG. 4 is a block diagram illustrating a configuration of an image sensor according to an example embodiment. Referring to FIG. 4, an image sensor 100A may correspond to the image sensor 100 of FIG. 1. FIG. 4 illustrates an example in which some components of the image sensor 100A are omitted, for ease of description.

Referring to FIG. 4, the image sensor 100A may include a pixel array 210, a row driver 220, a switch circuit 230, a pixel load circuit 240, a bias circuit 250, and a readout circuit 260. The pixel array 210, the row driver 220, the switch circuit 230, the pixel load circuit 240, the bias circuit 250, and the readout circuit 260 of the image sensor 100A may correspond to the pixel array 110, the row driver 120, the switch circuit 193, the pixel load circuit 195, the bias circuit 191, and the readout circuit 150 of the image sensor 100 of FIG. 1.

Each of the pixel units PU11 to PU14, PU21 to PU24, PU31 to PU34, and PU41 to PU44 of FIG. 4 may be one of the pixel units PU of FIGS. 1, 2A, 3A, 3B, 3C, and 3D. However, the configuration of each of the pixel units PU11 to PU14, PU21 to PU24, PU31 to PU34, and PU41 to PU44 according to an example embodiment is not limited to the configuration of the pixel unit PU of FIGS. 1, 2A, 3A, 3B, 3C, and 3D.

In FIG. 4, an example is provided in which a pixel array 210 includes 16 pixel units PU11 to PU14, PU21 to PU24, PU31 to PU34, and PU41 to PU44, for ease of description. However, according to the present invention, the pixel array 210 may include a different number of pixel units.

For ease of description, FIG. 4 illustrates an example in which each column is connected to two output lines. However, according to the present invention, each column may be connected to a different number of output lines. For example, each of the columns may be connected to one output line, or three or more output lines.

Referring to FIG. 4, each column of the pixel array 210 may be connected to two output lines. For example, pixel units PU11, PU21, PU31, and PU41 of a first column may each be connected, in pairs, to a first output line COL11 and a second output line COL12.

In an example embodiment, unlike what is illustrated in FIG. 4, pixel units of the same column may be alternately connected to each of the plurality of output lines one by one.

Continuing to refer to FIG. 4, output lines COL11, COL12, COL21, COL22, COL31, COL32, COL41, and COL42 may each transmit a pixel signal to a readout circuit 260 through corresponding nodes N1 and N2. For example, the first output line COL11 of the first column may transmit a pixel signal to the readout circuit 260 through the first node N1, and the second output line COL12 of the first column may transmit a pixel signal to the readout circuit 260 through the second node N2.

The output lines COL11, COL12, COL21, COL22, COL31, COL32, COL41, and COL42 may be connected to a pixel load circuit 240 through corresponding nodes N1 and N2 and a switch circuit 230. The switch circuit 230 may include a multiplexer.

FIG. 4 illustrates an example in which the output lines COL11, COL12, COL21, COL22, COL31, COL32, COL41, and COL42 are connected to first pixel load circuits PL11, PL21, PL31, and PL41 and second pixel load circuits PL12, PL22, PL32, and PL42 through four switch circuits SW1, SW2, SW3, and SW4, but the configurations of the switch circuits may be different from those in the embodiment of FIG. 4.

For example, when each of the columns is connected to four output lines, each of the output lines may be connected to one of the four pixel load circuits through a switch circuit. The switch circuit may have a structure in which a plurality of multiplexers are connected.

A pixel load circuit 240 according to an example embodiment may include a plurality of pixel load circuits. FIG. 4 illustrates an example in which the image sensor 100A includes a total of eight pixel load circuits PL11, PL21, PL31, PL41, PL12, PL22, PL32, and PL42 corresponding to the number of output lines COL11, COL12, COL21, COL22, COL31, COL32, COL41, and COL42. As described above, the number of output lines connected to each column may vary according to example embodiments, and the pixel load circuit 240 may include a different number of pixel load circuits than in FIG. 4. The plurality of pixel load circuits may be arranged adjacent to each other in a direction, parallel to a row.

Each of the output lines COL11, COL12, COL21, COL22, COL31, COL32, COL41, and COL42 may be connected to one pixel load circuit, among the first pixel load circuits PL11, PL21, PL31, and PL41 and the second pixel load circuits PL12, PL22, PL32, and PL42, through the switch circuit 230. For example, the first output line COL11 of the first column may be connected to the first pixel load circuit PL11 of the first column through the first switch circuit SW1, and the second output line COL12 of the first column may be connected to the second pixel load circuit PL12 of the first column through the first switch circuit SW1. Alternatively, the first output line COL11 of the first column may be connected to the second pixel load circuit PL12 of the first column and the second output line COL12 of the first column may be connected to the first pixel load circuit PL11 of the first column, based on the operation of the pixel array 210.

The pixel load circuits PL11, PL21, PL31, PL41, PL12, PL22, PL32, and PL42 according to an example embodiment may have the same structure. Each of the pixel load circuits PL11, PL21, PL31, PL41, PL12, PL22, PL32, and PL42 may be supplied with the same magnitude of bias voltage from a bias circuit (BC) 250.

The pixel load circuits PL11, PL21, PL31, PL41, PL12, PL22, PL32, and PL42 may be controlled in different ways based on the operation of the pixel array 210. For example, the magnitude of a first current flowing through one of the first pixel load circuits PL11, PL21, PL31, and PL41 may be smaller than the magnitude of a second current flowing through one of the second pixel load circuits PL12, PL22, PL32, and PL42. Alternatively, the magnitude of a first current flowing through one of the first pixel load circuits PL11, PL21, PL31, and PL41 may be larger than the magnitude of a second current flowing through one of the second pixel load circuits PL12, PL22, PL32, and PL42. Alternatively, the magnitude of a first current flowing through one of the first pixel load circuits PL11, PL21, PL31, and PL41 may be equal to the magnitude of a second current flowing through one of the second pixel load circuits PL12, PL22, PL32, and PL42.

Figure 5:
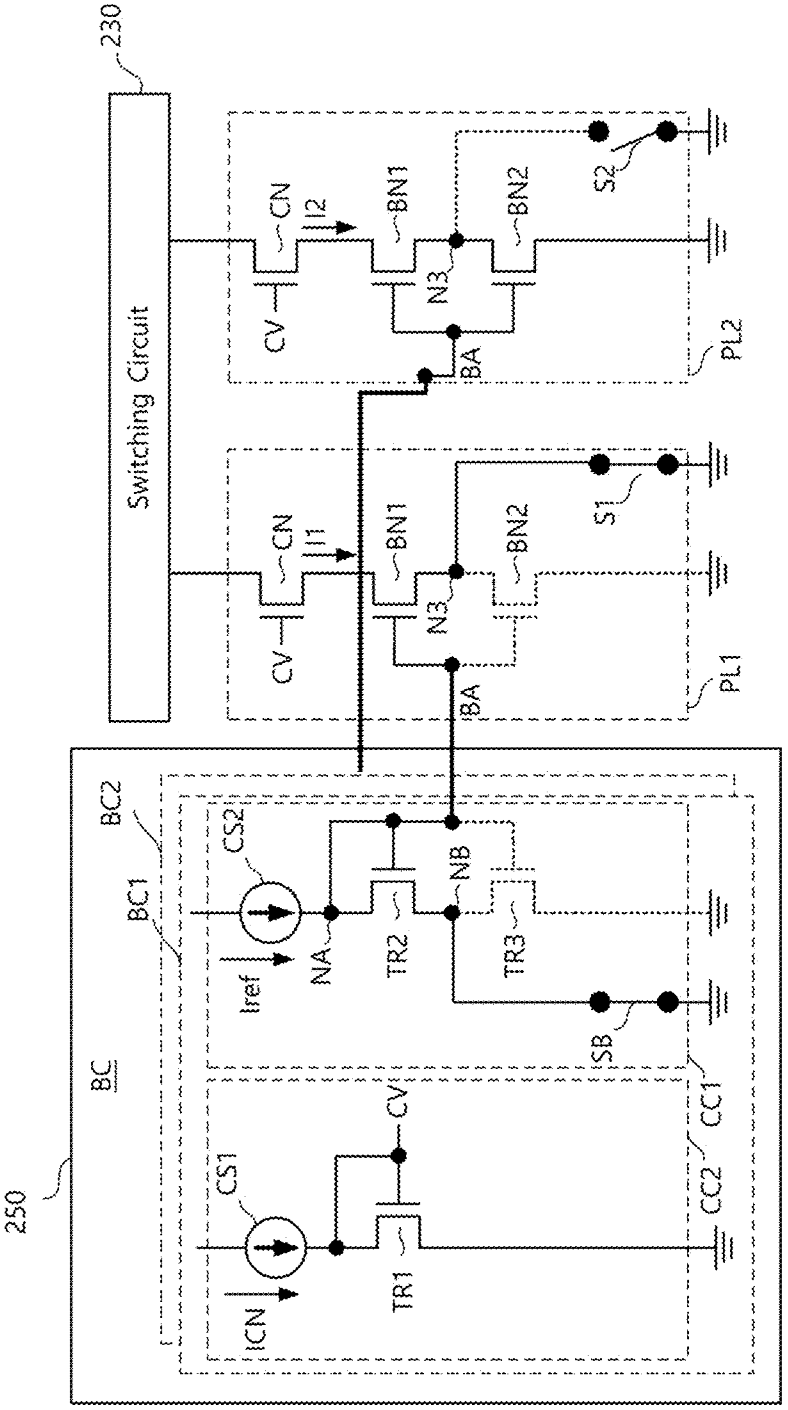
FIG. 5 is a circuit diagram illustrating an example of a bias circuit and a pixel load circuit of the image sensor according to an example embodiment.

FIG. 5 is a circuit diagram illustrating an example of the bias circuit 250 and pixel load circuits PL1 and PL2 of the image sensor 100 or 100A according to an example embodiment. The pixel load circuits PL1 and PL2 of FIG. 5 may correspond to pixel load circuits, corresponding to the same column, among the pixel load circuits PL11, PL21, PL31, PL41, PL12, PL22, PL32, and PL42 of FIG. 4. For example, the pixel load circuits PL1 and PL2 of FIG. 5 may correspond to the pixel load circuits PL11 and PL12 of FIG. 4.

The pixel load circuits PL1 and PL2 according to an example embodiment may have the same structure.

Referring to FIG. 5, each of the pixel load circuits PL1 and PL2 may include a cascode transistor CN and first and second bias transistors BN1 and BN2.

The first and second bias transistors BN1 and BN2 of each of the pixel load circuits PL1 and PL2 may be connected in series. For example, one of source/drain nodes of the first bias transistor BN1 may be connected to one of source/drain nodes of the second bias transistor BN2.

Gate nodes of the first and second bias transistors BN1 and BN2 of each of the pixel load circuits PL1 and PL2 may be connected to each other and may receive a bias voltage BA.

One of the first and second bias transistors BN1 and BN2 may be connected in series to the cascode transistor CN, and the other transistor may be connected to a ground node. For example, referring to FIG. 5, one of the source/drain nodes of the first bias transistor BN1 may be connected to the cascode transistor CN, and one of the source/drain nodes of the second bias transistor BN2 may be connected to the ground node.

The pixel load circuit PL1 may include a control switch S1 connecting a third node N3 between the first bias transistor BN1 and a second bias transistor BN2 to the ground node. The pixel load circuit PL2 may include a control switch S2 connecting a third node N3 between the first bias transistor BN1 and the second bias transistor BN2 to the ground node. Each of the control switch S1 and S2 may be a switching transistor.

The pixel load circuits PL1 and PL2 may receive the same magnitude of bias voltage BA from corresponding bias circuits BC1 and BC2 at the common gate node of the first bias transistor BN1 and the second bias transistor BN2, respectively. For example, the bias circuits BC1 and BC2 may have the same structure and may each supply a bias voltage BA to each of the pixel load circuits PL1 and PL2. The bias circuits BC1 and BC2, respectively corresponding to the pixel load circuits PL1 and PL2, may include the same constant current source CS2. The constant current source CS2 of each of the bias circuits BC1 and BC2 may supply a constant current Iref of the same magnitude to a transistor TR2 of each of the bias circuits BC1 and BC2.

Each of the bias circuits BC1 and BC2 may include a current mirror circuit CC1 corresponding to each of the pixel load circuits PL1 and PL2. The current mirror circuit CC1 may include a constant current source CS2, the transistor TR2 and a transistor TR3 connected in series and sharing a common gate node of the transistors TR2 and TR3, and a switch SB connecting a node NB between the transistors TR2 and TR3 to a ground node. For example, in the current mirror circuit CC1, the common gate node of the transistors TR2 and TR3 may be connected to a node NA between the constant current source CS2 and the transistor TR2, and the bias voltage BA may be output from the node NA. In an example embodiment, the current mirror circuit CC1 may further include a transistor TR4 (not shown) connected in series between the constant current source CS2 (or the node NA) and the transistor TR2. In this case, in the current mirror circuit CC1, the common gate node of the transistors TR2 and TR3 may be connected to a node NA between the constant current source CS2 and the transistor TR4, the bias voltage BA may be output from the node NA, and a gate node of the transistor TR4 may be connected to a gate node of the cascode transistor CN of the pixel load circuits PL1. A current I1 of the pixel load circuit PL1 having the same magnitude as the current Iref flowing through the current mirror circuit CC1 may be mirrored to the first pixel load circuit PL1. A current I2 of the pixel load circuit PL2 having a smaller magnitude than the current Iref flowing through the current mirror circuit CC1 may be mirrored to the second pixel load circuit PL2.

Each of the bias circuits BC1 and BC2 may include a cascode circuit CC2 transmitting a control voltage CV to a gate node of the cascode transistor CN of each of the pixel load circuits PL1 and PL2. The cascode circuit CC2 may output the control voltage CV operating the cascode transistors CN of each of the pixel load circuits PL1 and PL2 in a saturation region. The cascode circuit CC2 may include a constant current source CS1, allowing a constant current ICN to flow, and a transistor TR1 having one source/drain node connected to the constant current source CS1 and the other source/drain node connected to the ground node. A gate node of the transistor TR1 may be connected to the constant current source CS1. For example, the control voltage CV may be output from a common node connected to the gate node of the transistor TR1, the one source/drain node of the transistor TR1, and the constant current source CS1.

An effective aspect ratio of the pixel load circuits PL1 and PL2 according to an example embodiment may vary depending on operating states of the control switch S1 and S2. The effective aspect ratio may be an aspect ratio affecting each of the pixel load circuits PL1 and PL2 based on the operating states of the control switch S1 and S2. For example, an electrical path may change when the control switch S1 of the pixel load circuit PL1 and the control switch S2 of the pixel load circuit PL2 are in either an ON or OFF state. In the OFF state of the control switches S1 and S2, an aspect ratio of the second bias transistor BN2 may not affect the pixel load circuits PL1 and PL2. Herein, the aspect ratio of a transistor may be width/length (W/L) of the transistor. The magnitude of the current flowing through the pixel load circuits PL1 and PL2 may be controlled by setting an aspect ratio W/L of each of the first and second bias transistors BN1 and BN2 to an appropriate value.

Accordingly, although the image sensor is supplied with the same bias voltage BA from the bias circuit 250, the magnitude of the current flowing through the output line corresponding to each of the pixel load circuits PL1 and PL2 may be controlled by controlling the control switches S1 and S2. As a result, the image sensor may not include additional bias circuits supplying different magnitudes of bias voltage. For example, the image sensor may use a single type of bias circuit, supplying the same magnitude of bias voltage to the pixel load circuits, to prevent the output line from floating.

In an example embodiment, the aspect ratios of the first and second bias transistors BN1 and BN2 may be the same. For example, when the aspect ratios of the first and second bias transistors BN1 and BN2 are the same, the magnitude of a current flowing through each of the pixel load circuits PL1 and PL2 may be substantially equal to the magnitude of the first current I1 flowing through the pixel load circuit PL1 and the second pixel load circuit PL2 in both the ON and OFF states of the control switches S1 and S2.

In an example embodiment, the aspect ratios of the first and second bias transistors BN1 and BN2 may be different from each other. For example, referring to FIG. 5, the first aspect ratio of the first bias transistor BN1 may be different from the second aspect ratio of the second bias transistor BN2.

The magnitude of the current flowing through each of the pixel load circuits PL1 and PL2 may be adjusted based on a harmonic mean of the aspect ratios of the first bias transistor BN1 and the second bias transistor BN2 connected in cascode. For example, the operating state of the control switch S1 and S2 of one of the pixel load circuits PL1 and PL2 may be different from the operating state of a corresponding switch SB of the bias circuits BC1 and BC2.

For example, referring to FIG. 5, the control switch S1 of the pixel load circuit PL1 is in the ON state, so that the first current I1 passing through the first bias transistor BN1 of the pixel load circuit PL1 may flow along an electrical path through the control switch S1. In addition, the control switch S2 of the second pixel load circuit PL2 is in the OFF state, so that the second current I2 passing through the first bias transistor BN1 of the pixel load circuit PL2 may flow along an electrical path through the second bias transistor BN2 of the pixel load circuit PL2.

The magnitude of the second current I2 flowing through the second pixel load circuit PL2 may be smaller than the magnitude of the first current I1. Accordingly, the magnitude of the current flowing through the pixel load circuit may be controlled by setting the ratio of the aspect ratios of the first bias transistor BN1 and the second bias transistor BN2 of the pixel load circuit to different values and by controlling the operations of the control switches S1 and S2.

For example, when the aspect ratio of the second bias transistor BN2 is set to ¼ of the aspect ratio of the first bias transistor BN1 and the control switches S1 and S2 are controlled to be in the OFF state, the magnitude of the current flowing through the pixel load circuit may be approximately ⅕.

An image sensor according to an optionally alternative embodiment may include a plurality of types of bias circuits, selectively supply different magnitudes of bias voltage to the pixel load circuits, to prevent an output line from floating and to allow a small magnitude of current to flow through the pixel load circuit. Among pixel load circuits of the image sensor according to an alternative embodiment, a first pixel load circuit and a second pixel load circuit, respectively connected to a first output line and a second output line connected to the same column, may be disposed adjacent to each other. However, the first pixel load circuit and the second pixel load circuit of the image sensor according to the alternative embodiment may receive different magnitudes of bias voltage.

In an example embodiment, the image sensor may include bias circuits outputting the same magnitude of bias voltage, rather than including a plurality of types of bias circuits outputting different magnitudes of bias voltage. For example, the magnitude of the current flowing through the pixel load circuit may be controlled by setting aspect ratios of the bias transistors, connected in series included in the pixel load circuit, to appropriate values and controlling a control switch connected between nodes of the bias transistors. As a result, even when all the pixel load circuits of the image sensor are turned on, power consumption may be reduced with a simple circuit configuration. In addition, the image sensor does not include a plurality of types of bias circuits outputting different magnitudes of bias voltage but uses bias circuits outputting the same magnitude of bias voltage, so that the layout of the bias circuits may be simplified. In addition, each of the bias circuits outputs the same magnitude of bias voltage, the layout of interconnections for supplying a bias voltage to a pixel load circuit may be simplified. An area occupied by each circuit and interconnection may be reduced. As a result, the pixel load circuits connected to each of the output lines connected to the same column and disposed adjacent to each other may receive the same magnitude of bias voltage.

The aspect ratios of the first bias transistors BN1 of the pixel load circuits PL1 and PL2 may be substantially the same. The aspect ratios of the second bias transistors BN2 of the pixel load circuits PL1 and PL2 may be substantially the same.

In FIG. 5, the operating states of the control switches S1 and S2 of the pixel load circuits PL1 and PL2 are illustrated as being controlled in different ways. Unlike what is illustrated in the embodiment of FIG. 5, the operating state of each of the control switches S1 and S2 of the pixel load circuits PL1 and PL2 may be maintained in an ON state based on the operation of the pixel array 210. For example, control switches of pixel load circuits corresponding to output lines connected to the same column may all be maintained in the ON state. Alternatively, control switches of some of the pixel load circuits corresponding to the output lines connected to the same column may be maintained in the ON state, and control switches of other pixel load circuits may be maintained in the OFF state.

In an example embodiment, the operating states of the control switches S1 and S2 of the adjacent pixel load circuits may be controlled in different ways, depending on the operation modes.

Figure 6:
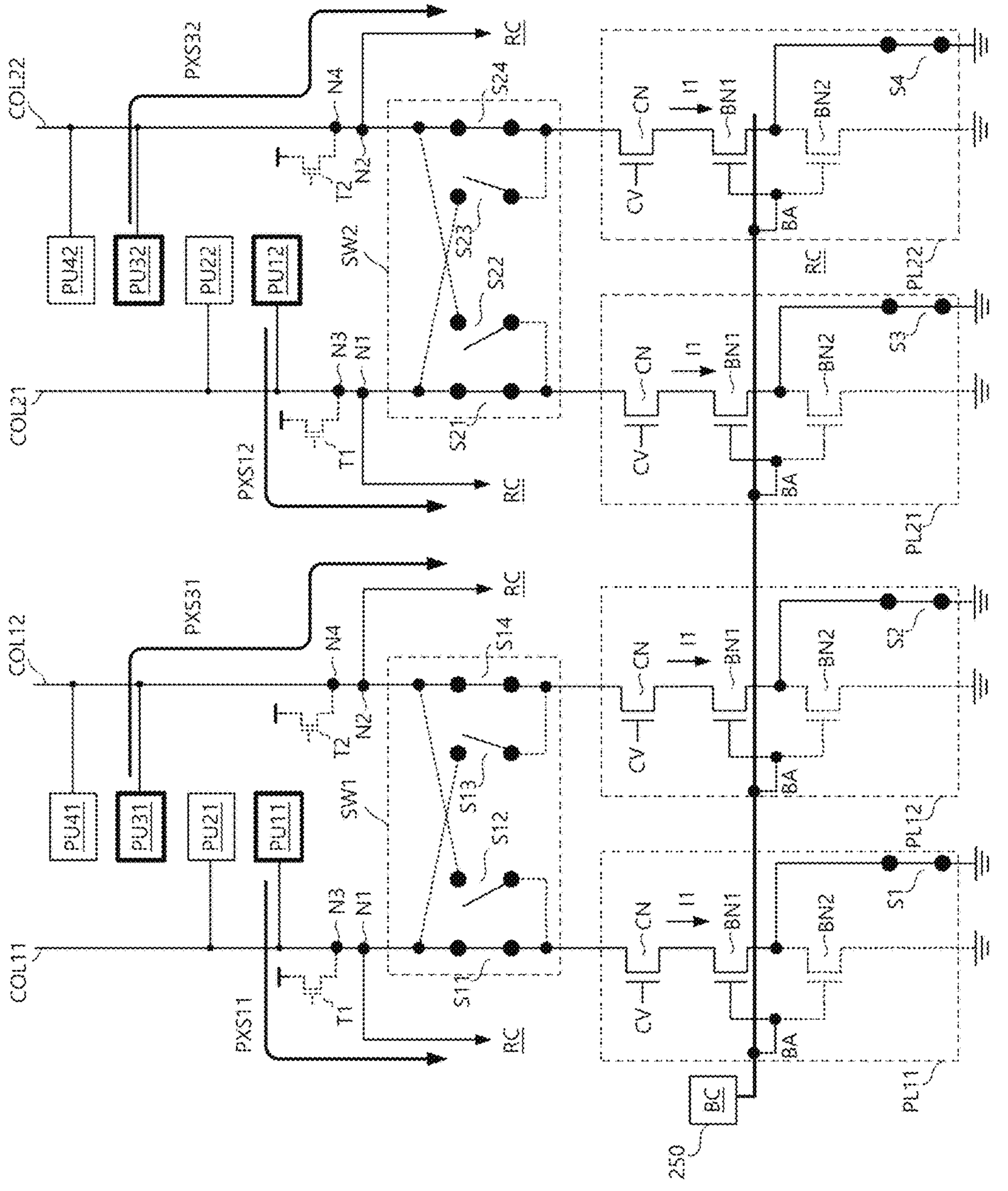
FIG. 6 is a diagram illustrating an operation of the image sensor at a full-frame rate according to an example embodiment.

FIG. 6 is a diagram illustrating an operation of the image sensor 100 or 100A at a full-frame rate using the pixel load circuits PL1 and PL2 of FIG. 5 in the first operation mode according to an example embodiment. FIG. 6 illustrates an operation at a full-frame rate at which all output lines, connected to each column of the image sensor 100A, output pixel signals in the same time period.

FIG. 6 illustrates an example of first column pixel units PU11, PU21, PU31, and PU41 and second column pixel units PU12, PU22, PU32, and PU42 among columns of the image sensor 100A of FIG. 4. In addition, third column pixel units PU13, PU23, PU33, and PU43 and fourth column pixel units PU14, PU24, PU34, and PU44 of the image sensor 100A may operate similarly to the first column pixel units PU11, PU21, PU31, and PU41 and the second column pixel units PU12, PU22, PU32, and PU42.

Referring to FIG. 6, the first column pixel units PU11, PU21, PU31, and PU41 may be connected to a first output line COL11 and a second output line COL12 of the first column, and the second column pixel units PU12, PU22, PU32, and PU42 may be connected to a first output line COL21 and a second output line COL22 of the second column.

First and second output lines of each column may output pixel signals in the same time period. For example, the first output line COL11 and the second output line COL12 of the first column may output pixel signals PXS11 and PXS31 of the pixel unit PU11 and the pixel unit PU31 in a first time period, respectively. The pixel signals PXS11 and PXS31 may be transmitted to a readout circuit RC through a first node N1 of the first output line COL11 and a second node N2 of the second output line COL12, respectively.

In the first time period, the first output line COL21 and the second output line COL22 of the second column may output pixel signals PXS12 and PXS32 of the pixel unit PU12 and the pixel unit PU32, respectively. The pixel signals PXS12 and PXS32 may be transmitted to the readout circuit RC through a first node N1 of the first output line COL21 and a second node N2 of the second output line COL22, respectively.

For example, the pixel array of FIG. 6 may operate in a 2-row simultaneous readout (2RSR) method where pixel signals of two rows are output within the same time period.

Similarly, output lines COL31 and COL32 connected to the third column and output lines COL41 and COL42 connected to the fourth column of FIG. 4 may also output pixel signals in the first time period. For example, in the image sensor 100A of FIG. 6, all output lines connected to the pixel array may output pixel signals at the same time period.

In a first mode of full-frame rate, each of the output lines of the image sensor 100A may be connected to a pixel load circuit having a control switch set to an ON state.

For example, referring to FIG. 6, the first output line COL11 of the first column may be connected to the first pixel load circuit PL11 of the first column through a switch S11, and the second output line COL12 of the first column is connected to the second pixel load circuit PL12 of the first column through a switch S14. The first output line COL21 of the second column may be connected to the first pixel load circuit PL21 of the second column through a switch S21, and the second output line COL22 of the second column may be connected to the second pixel load circuit PL22 of the second column through a switch S24.

In the first mode of full-frame rate, the control switches S1, S2, S3, and S4 of the pixel load circuits PL11, PL12, PL21, and PL22 may be maintained in the ON state during a readout operation. Therefore, the magnitude of a current I1 flowing through the pixel load circuits PL11, PL12, PL21, and PL22 may be based on a bias voltage BA and a first aspect ratio of a first bias transistor. The magnitudes of the current I1 flowing through the pixel load circuits PL11, PL12, PL21, and PL22 may all be the same.

In an example embodiment, the image sensor 100A may include transistors T1 and T2 connecting each of the output lines and a pixel power node. The transistors T1 and T2, connecting each of the output lines and the pixel power node, may be turned on to prevent a connected output line from floating when the connected output line is not driven.

Referring to FIG. 6, the image sensor 100A operates at a full-frame rate at which all output lines are driven, so that the transistors T1 and T2 may be turned off during the readout operation. Unlike what is illustrated in FIG. 6, nodes N3 and N4 connecting the transistors T1 and T2 and the output lines may be disposed within the readout circuit RC. Alternatively, unlike what is illustrated in FIG. 6, the nodes N3 and N4 may be disposed farther from pixel units PUs than the nodes N1 and N2.

Figure 7:
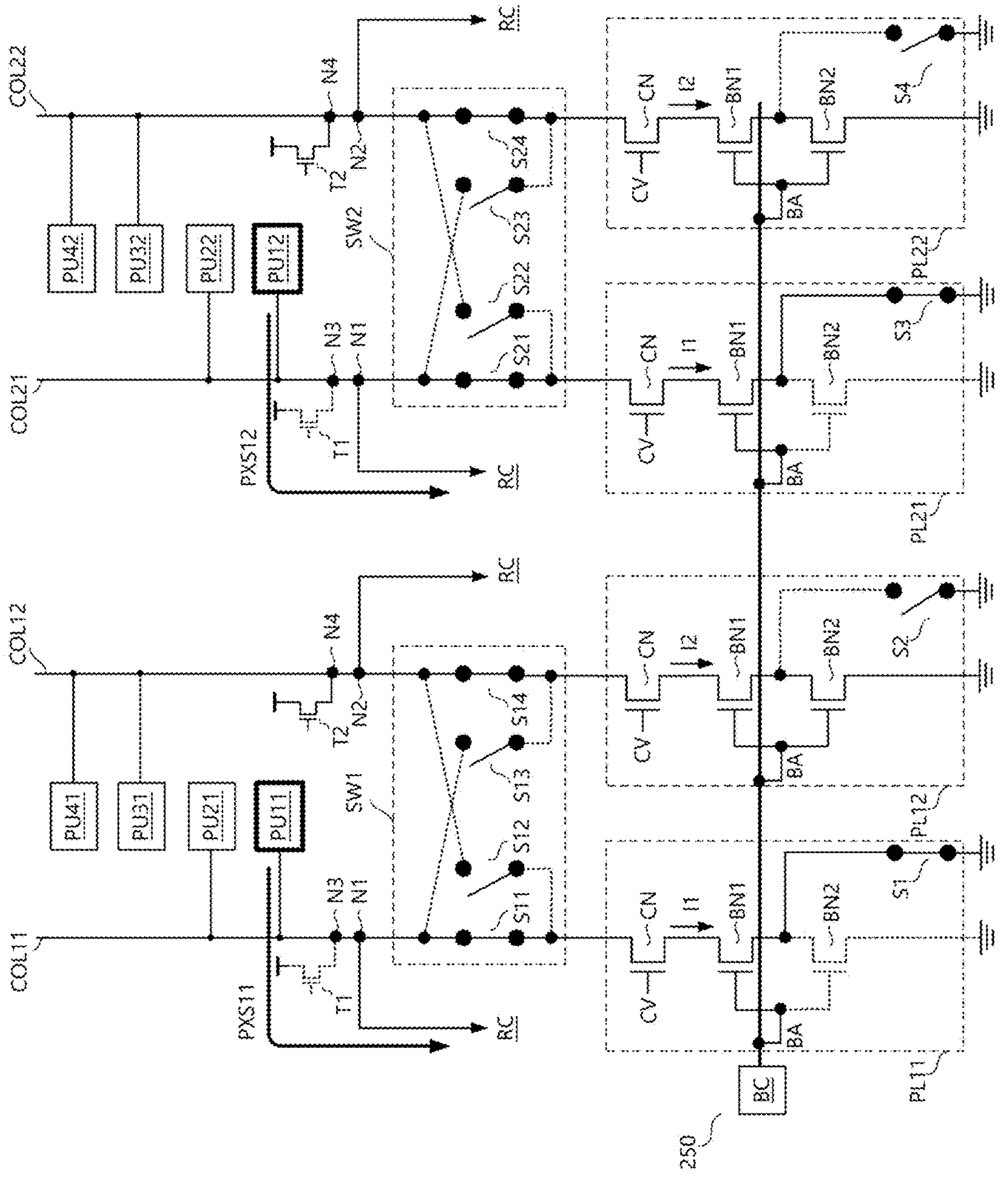
FIG. 7 is a diagram illustrating an operation of the image sensor at a half-frame rate during a first readout period according to an example embodiment.
Figure 8:
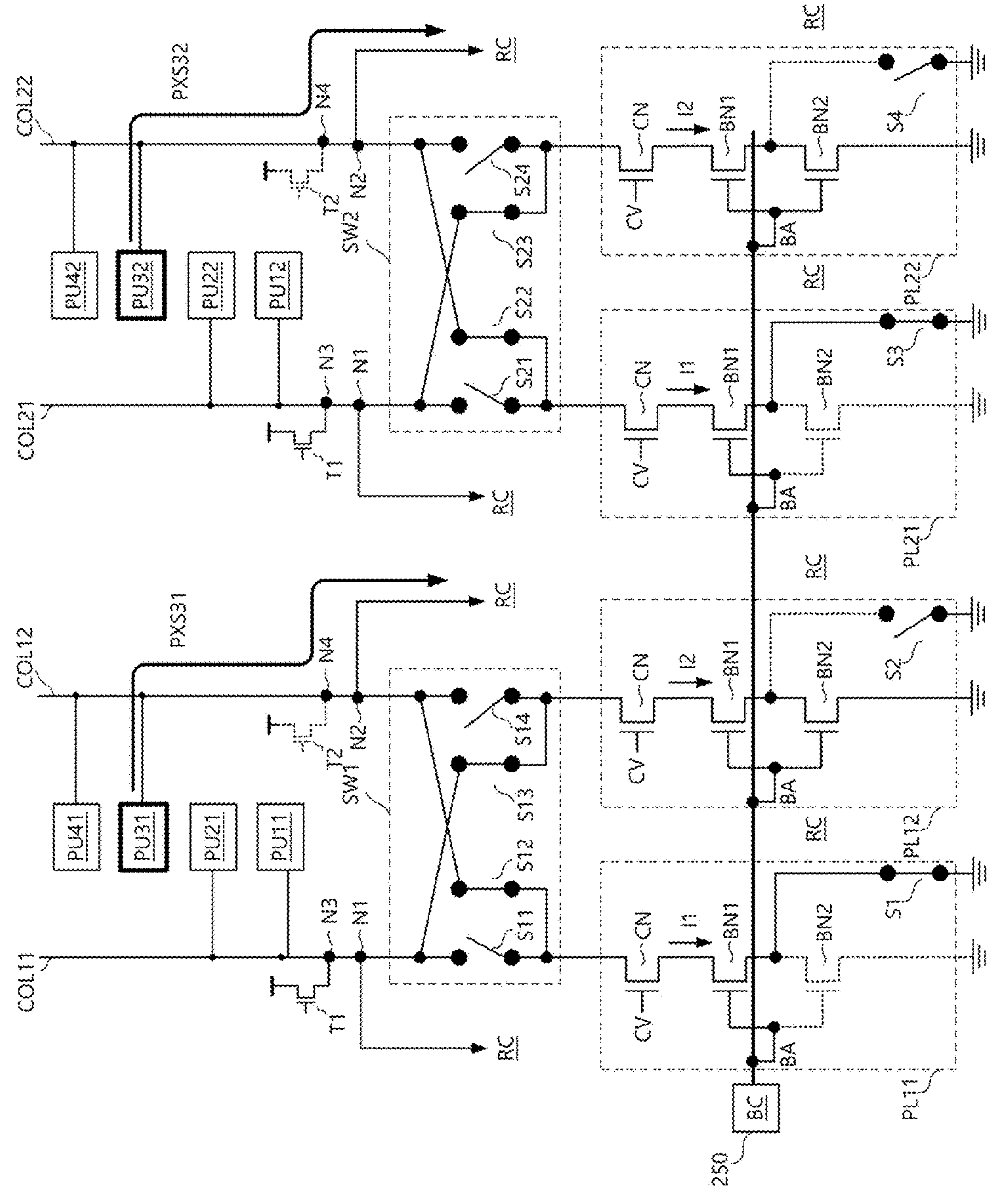
FIG. 8 is a diagram illustrating an operation of the image sensor at a half-frame rate during a second readout period according to an example embodiment.

FIG. 7 is a diagram illustrating the operation of the image sensor 100 or 100A at a half-frame rate using the pixel load circuits PL1 and PL2 of FIG. 5 during a first readout period according to an example embodiment. FIG. 8 is a diagram illustrating the operation of the image sensor 100 or 100A at a half-frame rate using the pixel load circuits PL1 and PL2 of FIG. 5 during a second readout period subsequent to the first readout period according to an example embodiment.

FIGS. 7 and 8 illustrate that the image sensor 100A operates at a half-frame rate at which half of output lines, connected to each column of the image sensor 100A, output pixel signals in the same time period.

The operation of the image sensor 100A at a half-frame rate will be described with reference to FIGS. 7 and 8. Detailed descriptions that overlap or are similar to the descriptions provided with reference to FIG. 6 will be omitted to avoid unnecessary repetition.

FIG. 7 illustrates an example of first column pixel units PU11, PU21, PU31, and PU41 and second column pixel units PU12, PU22, PU32, and PU42, among columns of the image sensor 100A of FIG. 4. In addition, third column pixel units PU13, PU23, PU33, and PU43 and fourth column pixel units PU14, PU24, PU34, and PU44 of the image sensor 100A of FIG. 4 may operate similarly to the first column pixel units PU11, PU21, PU31, and PU41 and the second column pixel units PU12, PU22, PU32, and PU42.

Referring to FIG. 7, unlike the operation of full-frame rate described with reference to FIG. 6, only one of first and second output lines of each column may output a pixel signal in a single time period.

For example, among a first output line COL11 and a second output line COL12 of a first column, the first output line COL11 may output a pixel signal PXS11 in the first readout period. Among a first output line COL21 and a second output line COL22 of a second column, the first output line COL21 may output a pixel signal PXS12 in the first readout period.

Similarly, a first output line COL31, among the first output line COL31 and a second output line COL32 connected to a third column, and a first output line COL41, among the first output line COL41 and a second output line COL42 connected to a fourth column, may output a pixel signal in the first readout period.

Output lines, which were not driven in the first readout period, may output pixel signals in a second readout period subsequent to the first readout period.

For example, referring to FIG. 8, the second output line COL12 of the first column and the second output line COL22 of the second column may output pixel signals PXS31 and PXS32, respectively, in the second readout period. Similarly, the second output line COL32 of the third column and the second output line COL42 of the fourth column may output pixel signals in the second readout period, respectively.

For example, in a second mode in which the image sensor 100A of FIGS. 7 and 8 operates at a half-frame rate, half of the output lines connected to the pixel array may output pixel signals at each identical time period.

Accordingly, the transistors T2 connected to the non-driven output lines COL12 and COL22 of FIG. 7 may be turned on to prevent the output lines COL12 and COL22 from floating. Similarly, the transistors T1 connected to the non-driven output lines COL11 and COL21 of FIG. 8 may be turned on to prevent the output lines COL11 and COL21 from floating.

In the second mode of the half-frame rate, each of the non-driven output lines of the image sensor 100A may be connected to a pixel load circuit having a control switch set to an OFF state. Accordingly, a small magnitude of current may flow through the pixel load circuit, connected to each of the non-driven output lines, to preventing the non-driven output lines from floating. In the second mode of the half-frame rate, similar to the first mode of the full-frame rate, each of the driven output lines of the image sensor 100A may be connected to a pixel load circuit having a control switch set to an ON state.

For example, referring to FIG. 7, the non-driven output lines COL12 and COL22 may be connected to pixel load circuits PL12 and PL22 through switches S14 and S24, respectively. The driven output lines COL11 and COL21 may be connected to pixel load circuits PL11 and PL21 through switches S11 and S21, respectively.

Referring to FIG. 8, the non-driven output lines COL11 and COL21 may be connected to pixel load circuits PL12 and PL22 through switches S13 and S23, respectively. The driven output lines COL12 and COL22 may be connected to pixel load circuits PL11 and PL21 through switches S12 and S22, respectively.

Referring to FIGS. 7 and 8, the pixel load circuits PL12 and PL22, through which a small magnitude of second current I2 flows, and the pixel load circuits PL11 and PL21, through which a relatively large magnitude of first current I1 flows, may both receive the same magnitude of bias voltage BA from the bias circuit (BC) 250 at gate nodes of the first and second bias transistors BN1 and BN2. Accordingly, the layout of the bias circuits BC may be simplified and an area occupied by the bias circuit BC may be reduced. In addition, the layout of interconnections for supplying the bias voltage BA may be simplified and an area occupied by the interconnections may be reduced.

In the same operation mode, the pixel load circuits PL12 and PL22, through which a small magnitude of second current I2 flows, and the pixel load circuits PL11 and PL21, through which a relatively large magnitude of first current I1 flows, may be maintained in the same operating state as the control switches S1 and S2, S3, and S4. Output lines driven by the switching circuits SW1 and SW2 and non-driven output lines may be appropriately connected to each of the pixel load circuits PL11, PL12, PL21, and PL22. Accordingly, the pixel load circuits PL11, PL12, PL21, and PL22 may be maintained in the same state, resulting in reduced noise in a pixel signal.

In FIGS. 7 and 8, the image sensor is illustrated as operating at a half-frame rate, but may operate at a lower frame rate based on the number of output lines connected to each column.

For example, four output lines may be connected to each column of the image sensor. The image sensor may operate at a full-frame rate at which all of the four output lines output pixel signals in the same readout period. Alternatively, the image sensor may operate at a half-frame rate at which two of the four output lines output pixel signals in the same readout period. Alternatively, the image sensor may operate at a quarter-frame rate at which one of the four output lines outputs pixel signal in the same readout period. When operating at a half-frame rate or a quarter frame rate, the non-driven output lines may be connected to a pixel load circuit having a control switch set to an OFF state. The driven output lines may be connected to a pixel load circuit having a control switch set to an ON state.

Figure 9:
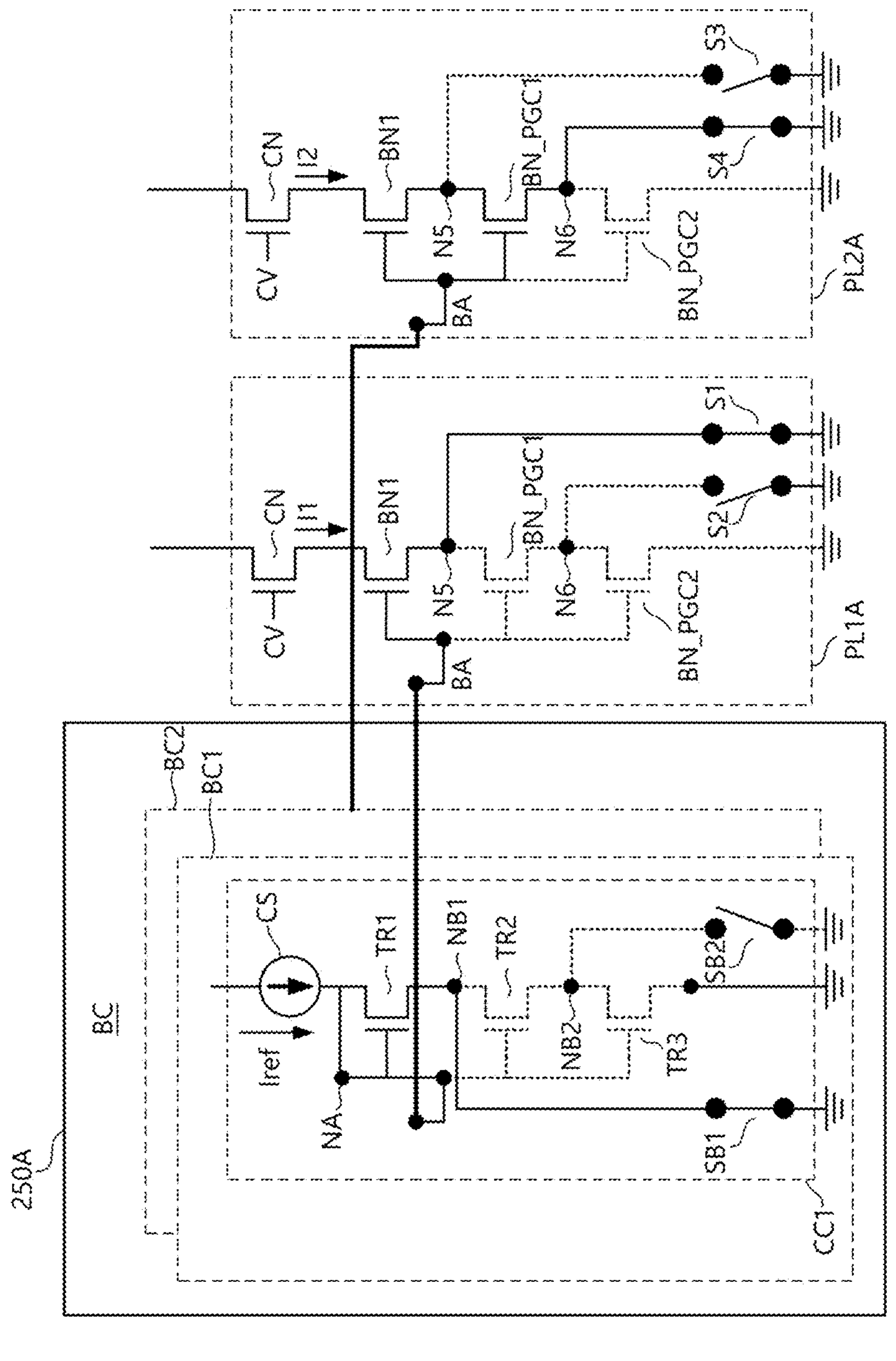
FIGS. 9 to 11 are circuit diagrams illustrating examples of operations of a bias circuit and a pixel load circuit of the image sensor according to an example embodiment.
Figure 10:
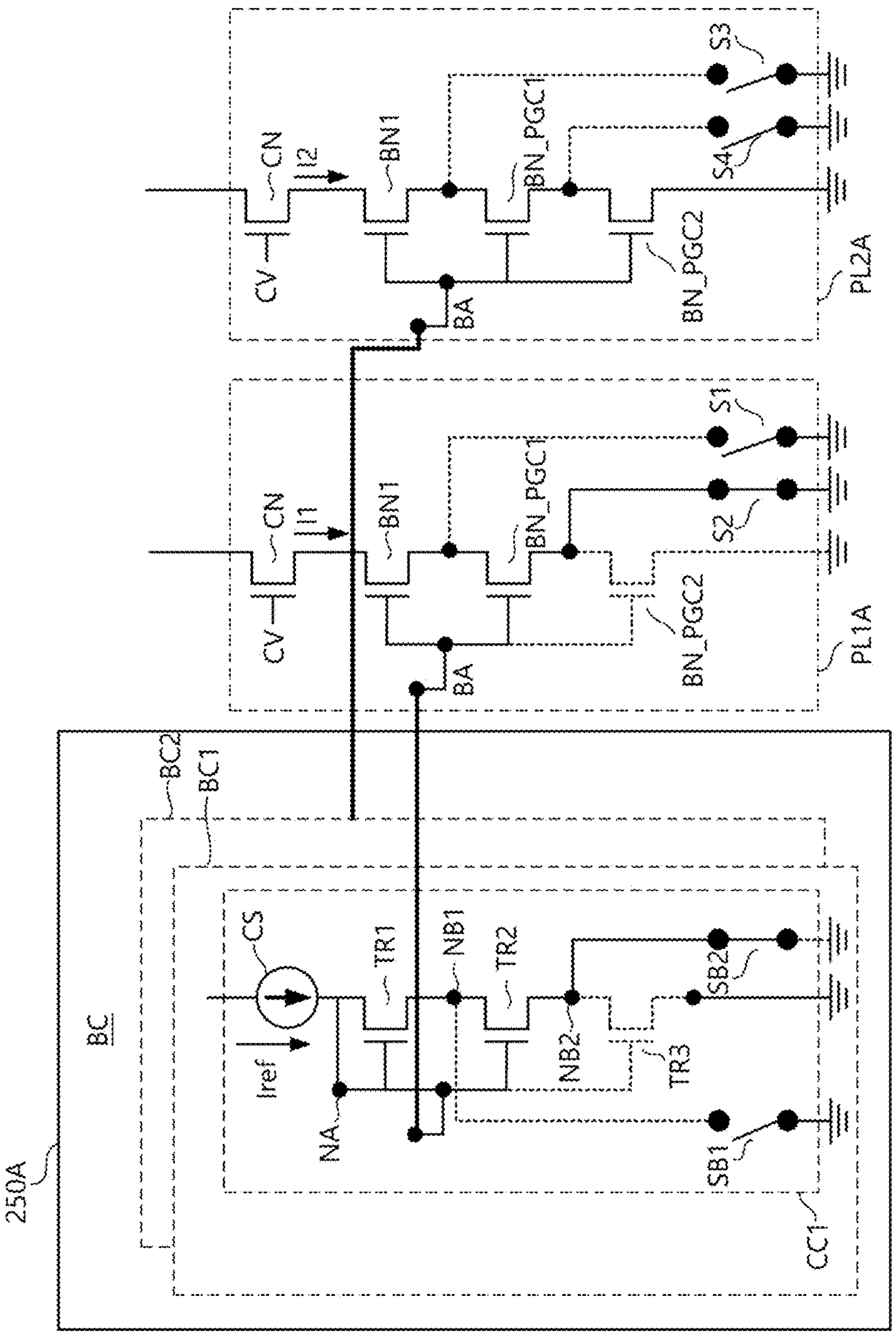
Figure 11:
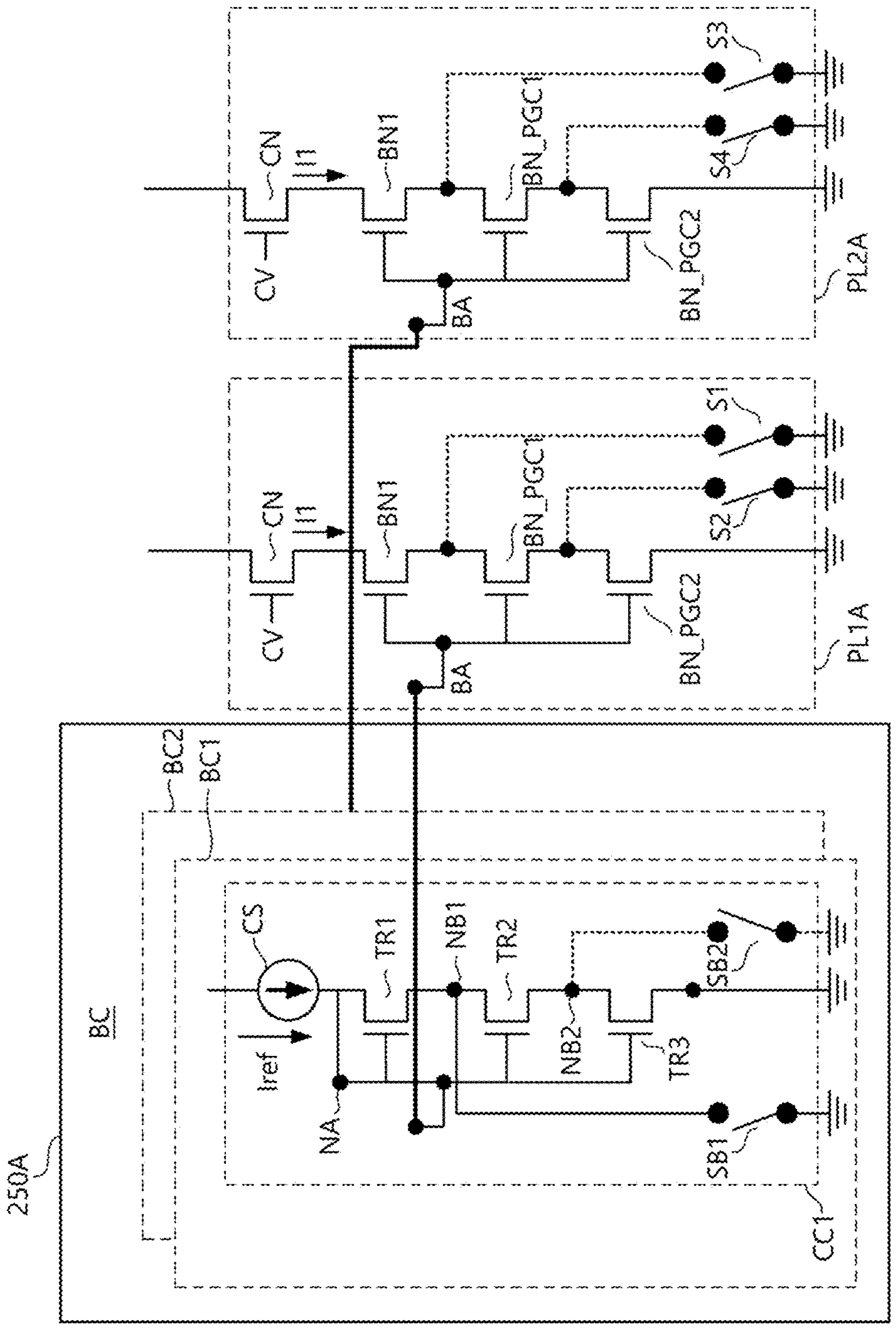

FIGS. 9 to 11 are circuit diagrams illustrating examples of the bias circuit 250 and the pixel load circuits PL1 and PL2 of FIG. 5 according to an example embodiment. A bias circuit 250A of FIGS. 9 to 11 may correspond to the bias circuit 250 of FIG. 4 or FIG. 5. The pixel load circuits PL1A and PL2A of FIGS. 9 to 11 may correspond to the pixel load circuits corresponding to the same column, among the pixel load circuits PL11, PL21, PL31, PL41, PL12, PL22, PL32, and PL42 of FIG. 4. For example, the pixel load circuits PL1A and PL2A of FIGS. 9 to 11 may correspond to the pixel load circuits PL11 and PL12 of FIG. 4 or the pixel load circuits PL1 and PL2 of FIG. 5.

The bias circuit 250A and the pixel load circuits PL1A and PL2A will be described with reference to FIGS. 9 to 11. Detailed descriptions that overlap or are similar to the descriptions provided with reference to FIG. 5 will be omitted to avoid unnecessary repetition.

The pixel load circuits PL1A and PL2A according to an example embodiment may have the same structure.

Referring to FIGS. 9 to 11, each of the pixel load circuits PL1A and PL2A may include first to third bias transistors BN1, BN_PGC1, and BN_PGC2 connected in series and two control switches connected to the first to third bias transistors BN1, BN_PGC1, and BN_PGC2, unlike the pixel load circuits PL1 and PL2 of FIG. 5. Gate nodes of the three bias transistors BN1, BN_PGC1, and BN_PGC2 may be connected to each other and may receive the same magnitude of bias voltage BA from the bias circuit (BC) 250A. The pixel load circuit PL1A may include control switches S1 and S2 and the pixel load circuit PL2A may include control switches S3 and S4. Each of the control switches S1 to S4 may be a switching transistor.

The first bias transistor BN1 may have a first aspect ratio, the second bias transistor BN_PGC1 may have a second aspect ratio, and the third bias transistor BN_PGC2 may have a third aspect ratio.

In an example embodiment, an effective aspect ratio of a pixel load circuit based on the first bias transistor BN1 may be larger than an effective aspect ratio of the pixel load circuit based on the first bias transistor BN1 and the second bias transistor BN_PGC1, and an effective aspect ratio of the pixel load circuit based on the first bias transistor BN1 and the second bias transistor BN_PGC1 may be larger than an effective aspect ratio of the pixel load circuit based on the first bias transistor BN1, the second transistor BN_PGC1, and the third bias transistor BN_PGC2. The first bias transistor BN1, the second bias transistor BN_PGC1, and the third bias transistor BN_PGC2 may be configured such that the pixel load circuits PL1A and PL2A have relative magnitudes of effective aspect ratios depending on the operating states of the control switches S1, S2, S3, and S4, as described above.

A first node N5 between the first bias transistor BN1 and the second bias transistor BN_PGC1 of each of the pixel load circuits PL1A and PL2A may be connected to a ground node through first control switches S1 and S3.

A second node N6 between the second bias transistor BN_PGC1 and the third bias transistor BN_PGC2 of each of the pixel load circuits PL1A and PL2A may be connected to the ground node through second control switches S2 and S4.

Referring to FIGS. 9 to 11, each of the bias circuits BC1 and BC2 may include a current mirror circuit CC1 corresponding to each of the pixel load circuits PL1A and PL2A. For example, each of the bias circuits BC1 and BC2 may have the same structure and may supply a bias voltage BA to each of the pixel load circuits PL1A and PL2A. The current mirror circuit CC1 may include a constant current source CS, transistors TR1, TR2, and TR3 connected in series and having gate nodes connected in common, and switches SB1 and SB2 connecting each of nodes NB1 and NB2 between the transistors TR1, TR2 and TR3 and the ground node. For example, in the current mirror circuit CC1, the common gate node of the transistors TR1, TR2, and TR3 may be connected to a node NA between the constant current source CS and the transistor TR1, and the bias voltage BA may be output from the node NA. In an example embodiment, the current mirror circuit CC1 may further include a transistor TR4 (not shown) connected in series between the constant current source CS (or the node NA) and the transistor TR1. In this case, in the current mirror circuit CC1, the common gate node of the transistors TR1, TR2 and TR3 may be connected to a node NA between the constant current source CS and the transistor TR4, the bias voltage BA may be output from the node NA, and a gate node of the transistor TR4 may be connected to a gate node of the cascode transistor CN of the pixel load circuit PL1A.

Each of the bias circuits BC1 and BC2 may include a cascode circuit, not illustrated, transmitting a control voltage CV to the gate node of the cascode transistor CN of each of the pixel load circuits PL1A and PL2A. The cascode circuit, not illustrated, may be the same as the cascode circuit CC2 described with reference to FIG. 5.

Each of the pixel load circuits PL1A and PL2A of FIGS. 9 to 11 may reduce transconductance of the pixel load circuit in addition to allowing a bias current to flow through a corresponding output line. By reducing the transconductance of the pixel load circuit, noise generated by heat, among components of a pixel signal, may be reduced. The transconductance of the pixel load circuit may be in proportion to an aspect ratio of bias transistors connected in series. Accordingly, by reducing the aspect ratio of the bias transistors, the transconductance of the pixel load circuit may be reduced and the noise generated by the heat, among the components of the pixel signal, may also be reduced. In the present specification, controlling the transconductance of the pixel load circuit may be referred to as pixel gain control (PGC).

FIG. 9 illustrates an operation in which pixel gain control is not used in the pixel load circuits PL1A and PL2A according to an example embodiment and the control switches S1 to S4 are controlled to allow currents I1 and I2 having different magnitudes to flow through the first pixel load circuit PL1A and the second pixel load circuit PL2A, respectively. For example, the first pixel load circuit PL1A may be connected to a driven output line, and the second pixel load circuit PL2A may be connected to a non-driven output line.

Referring to FIG. 9, the first control switch S1 of the first pixel load circuit PL1A is in an ON state, and the second control switch S2 of the first pixel load circuit PL1A is in an OFF state. For example, the current I1 flowing through the first pixel load circuit PL1A may flow to the ground node through the first bias transistor BN1 and the control switch S1 of the first pixel load circuit PL1A. In this case, the switch SB1 of the current mirror circuit CC1 is in an ON state, and the switch SB2 of the current mirror circuit CC1 is in an OFF state. For example, the constant current Iref flowing through the current mirror circuit CC1 of the bias circuit BC1 may flow to the ground node through the transistor TR1 and the switch SB1 of the current mirror circuit CC1. The first control switch S3 of the second pixel load circuit PL2A is in an OFF state, and the second control switch S4 of the second pixel load circuit PL2A is in an ON state. Therefore, a magnitude of the current I2 flowing through the second pixel load circuit PL2A may be smaller than a magnitude of the current I1 flowing through the first pixel load circuit PL1A, based on a harmonic mean of the aspect ratios of the first bias transistor BN1 and the second bias transistor BN_PGC1 of the second pixel load circuit PL2A. As a result, the second pixel load circuit PL2A may be connected to a non-driven output line, and the non-driven output line may be prevented from floating.

FIG. 10 illustrates an operation in which pixel gain control is used in the pixel load circuits PL1A and PL2A according to an example embodiment and the control switches S1 to S4 are controlled to allow currents I1 and I2 having different magnitudes to flow through the first pixel load circuit PL1A and the second pixel load circuit PL2A, respectively. For example, the first pixel load circuit PL1A may be connected to a driven output line, and the second pixel load circuit PL2A may be connected to a non-driven output line.

Referring to FIG. 10, the first control switch S1 of the first pixel load circuit PL1A is in an OFF state, and the second control switch S2 is in an ON state. For example, the current I1 flowing through the first pixel load circuit PL1A may flow to the ground node through the first and second bias transistors BN1 and BN_PGC1 and the control switch S2 of the first pixel load circuit PL1A. In this case, the switch SB1 of the current mirror circuit CC1 is in an OFF state, and the switch SB2 of the current mirror circuit CC1 is in an ON state. For example, the constant current Iref flowing through the current mirror circuit CC1 of the bias circuit BC1 may flow to the ground node through the transistors TR1 and TR2 and the switch SB2 of the current mirror circuit CC1. Both the first switch S3 and the second switch S4 of the second pixel load circuit PL2A are in an OFF state. Therefore, a magnitude of the current I2 flowing through the second pixel load circuit PL2A may be smaller than the magnitude of the current I1 flowing through the first pixel load circuit PL1A, based on a harmonic mean of aspect ratios of the first bias transistor BN1, the second bias transistor BN_PGC1, and the third bias transistor BN_PGC2 of the second pixel load circuit PL2A. As a result, the second pixel load circuit PL2A may be connected to a non-driven output line, and the non-driven output line may be prevented from floating.

In addition, transconductance of the pixel load circuits PL1A and PL2A of FIG. 10 may be smaller than transconductance of the pixel load circuits PL1A and PL2A of FIG.

9, based on an aspect ratio of each of the first bias transistor BN1, the second bias transistor BN_PGC1, and the third bias transistor BN_PGC2.

For example, the transconductance of the first pixel load circuit PL1A of FIG. 10 may be smaller than the transconductance of the first pixel load circuit PL1A of FIG. 9. In addition, the transconductance of the second pixel load circuit PL2A of FIG. 10 may be smaller than the transconductance of the second pixel load circuit PL2A of FIG. 9.

Accordingly, noise generated by heat, among components of a pixel signal of the pixel load circuits PL1A and PL2A of FIG. 10, may be smaller than noise generated by heat, among component of a pixel signal of the pixel load circuits PL1A and PL2A of FIG. 9.

FIG. 11 illustrates an operation in which pixel gain control is used in the pixel load circuits PL1A and PL2A according to an example embodiment and control switches S1 to S4 are controlled to allow currents I1 and I2 having the same magnitude to flow through the first pixel load circuit PL1A and the second pixel load circuit PL2A, respectively. For example, both the first pixel load circuit PL1A and the second pixel load circuit PL2A may be connected to a driven output line.

Referring to FIG. 11, first control switches S1 and S3 and second control switches S2 and S4 of both the first pixel load circuit PL1A and the second pixel load circuit PL2A are in an OFF state. In this case, the switches SB1 and SB2 of the current mirror circuit CC1 are in an OFF state. For example, the constant current Iref flowing through the current mirror circuit CC1 of the bias circuit BC1 may flow to the ground node through the transistors TR1, TR2, and TR3 of the current mirror circuit CC1. Therefore, the current I1 flowing through the first pixel load circuit PLA1 and the second pixel load circuit PL2A may flow along an electrical path of the first bias transistor BN1, the second bias transistor BN_PGC1, and the third bias transistor BN_PGC2.

In addition, transconductance of the pixel load circuits PL1A and PL2A of FIG. 11 may be smaller than transconductance of the pixel load circuits PL1A and PL2A of FIG. 9, based on an aspect ratio of each of the first bias transistor BN1, the second bias transistor BN_PGC1, and the third bias transistor BN_PGC2. Therefore, noise generated by heat, among components of a pixel signal of the pixel load circuits PL1A and PL2A of FIG. 11, may be smaller than noise generated by heat, among components of a pixel signal of the pixel load circuits PL1A and PL2A of FIG. 9.

In an example embodiment, the first control switches S1 and S3 of the first and second pixel load circuits PL1A and PL2A are in an OFF state, and the second control switches S2 and S4 are in an ON state. For example, the current I1 flowing through each of the first and second pixel load circuits PL1A and PL2A may flow to the ground node through the first and second bias transistors BN1 and BN_PGC1 and the second control switches S2 and S4, respectively. In this case, the switch SB1 of the current mirror circuit CC1 is in an OFF state, and the switch SB2 of the current mirror circuit CC1 is in an ON state. For example, the constant current Iref flowing through the current mirror circuit CC1 of the bias circuit BC1 may flow to the ground node through the transistors TR1 and TR2 and the switch SB2 of the current mirror circuit CC1.

Accordingly, the pixel load circuits PL1A and PL2A according to the embodiments of FIGS. 9 to 11 may receive the same bias voltage BA and control a current flowing through the pixel load circuits PL1A and PL2A by controlling the control switches S1, S2, S3, and S4. As a result, power consumption of the image sensor may be reduced by preventing a non-driven output lines from floating with a small magnitude of current. In addition, the same type of bias circuits 250A may be used to simplify the layout of a bias circuit and interconnections for supplying a bias voltage and reduce the complexity thereof.

In addition, the pixel load circuits PL1A and PL2A according to the embodiments of FIGS. 9 to 11 may reduce noise, generated by heat among components of a pixel signal, by reducing the transconductance of the pixel load circuits PL1A and PL2A using pixel gain control.

The image sensor may operate or not operate the pixel gain control under the control of an image signal processor.

Figure 12:
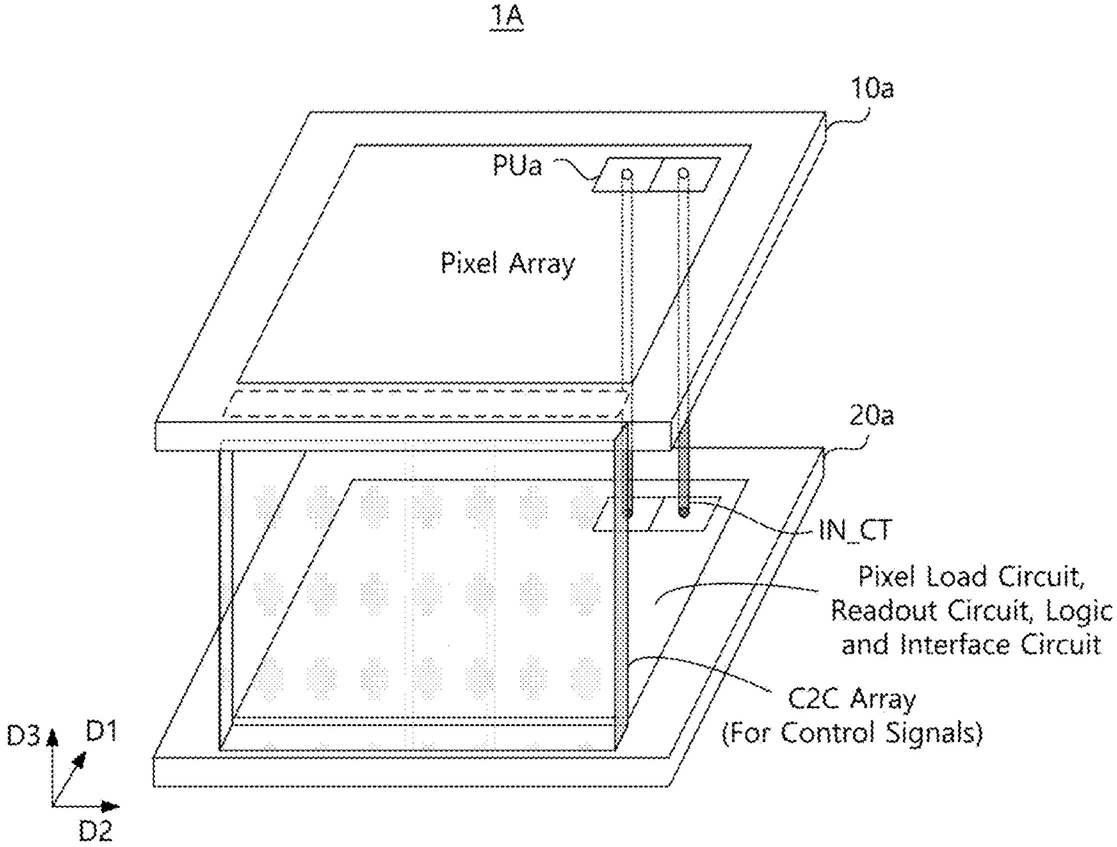
FIG. 12 is a block diagram of an image sensor according to an example embodiment.

FIG. 12 is a block diagram of an image sensor 1A according to an example embodiment. Detailed descriptions that overlap or are similar to the previous descriptions will be omitted to avoid unnecessary repetition.

The image sensor 1A may include a first substrate 10*a* and a second substrate 20*a* stacked sequentially. In an example embodiment, each of the first substrate 10*a* and the second substrate 20*a* may be formed and cut from a semiconductor wafer. In an example embodiment, the pixel array described above may be disposed on the first substrate 10*a* and the pixel load circuit and the readout circuit described above, and a logic and interface circuit may be disposed on the second substrate 20*a*. The first substrate 10*a* and the second substrate 20*a* may be connected to each other through a wafer bonding process using a pixel group-level copper-to-copper (C2C) interconnection. The first substrate 10*a* and the second substrate 20*a* may be electrically connected not only through an in-pixel contact IN_CT inside a pixel unit PUa but also through a copper-to-copper (C2C) array disposed in a peripheral region of a substrate. Control signals for controlling the pixel circuit may be transmitted through the C2C array. A pixel signal (or an image signal) of the first substrate 10*a* may be transmitted to a readout circuit (or an image processor) of the second substrate 20*a* through the in-pixel contact IN_CT.

In an example embodiment, pixel load circuits disclosed above may be disposed on the second substrate 20*a*.

Figure 13:
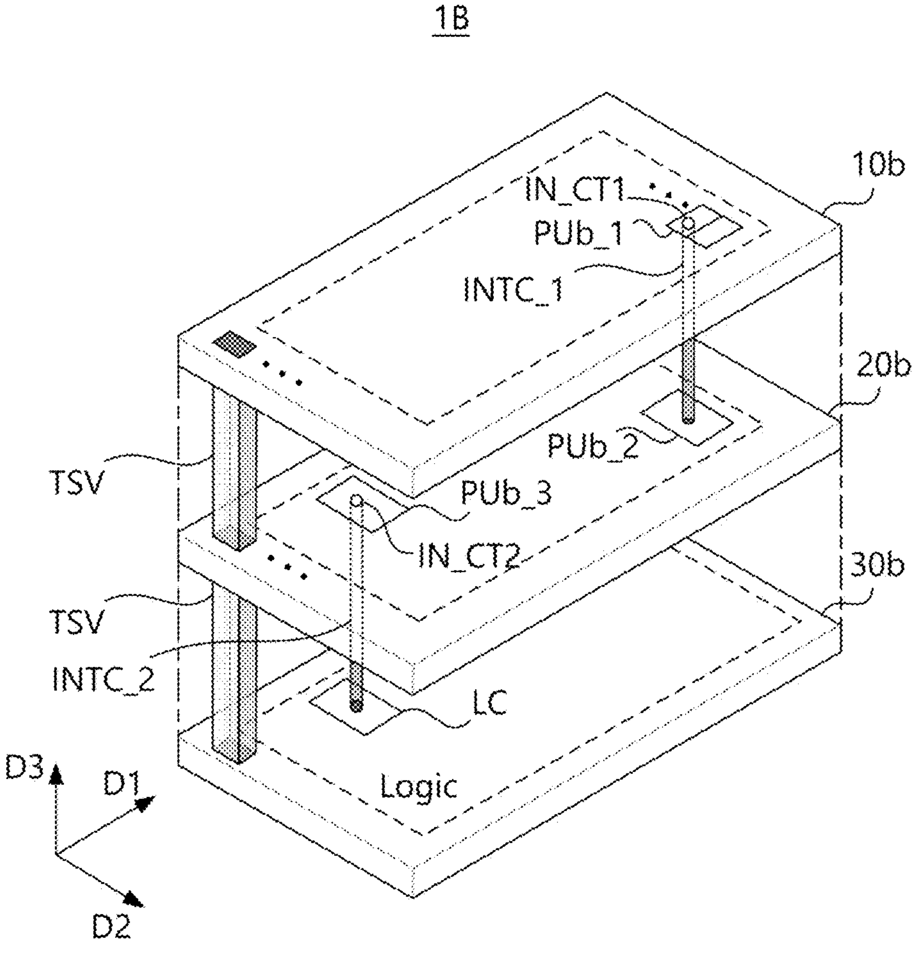
FIG. 13 is a block diagram of an image sensor according to an example embodiment.

FIG. 13 is a block diagram of an image sensor 1B according to an example embodiment. Detailed descriptions that overlap or are similar to the previous descriptions will be omitted to avoid unnecessary repetition.

Referring to FIG. 13, the image sensor 1B may include a first substrate 10*b*, a second substrate 20*b*, and a third substrate 30*b*. The third substrate 30*b*, the second substrate 20*b*, and the first substrate 10*b* may be sequentially stacked in a direction D3, perpendicular to a plane (a surface parallel to directions D1 and D2) of a substrate.

In an example embodiment, first to third portions of pixel circuit PUb_1, PUb_2, and PUb_3 constituting a pixel unit may be formed on each of the first substrate 10*b* and the second substrate 20*b*. The first portion of pixel circuit PUb_1 may be disposed on the first substrate 10*b* and the second and third portions of pixel circuit PUb_2 and PUb_3 may be disposed on the second substrate 20*b*. In an example embodiment, the pixel array described above may be disposed on the first and second substrates 10*b* and 20*b*. The third substrate 30*b* may include a logic circuit, such as a readout circuit, a timing controller, or an image signal processor, and an interface circuit. The readout circuit may include an ADC. In an example embodiment, the readout circuit, the timing controller, the image signal processor, and the interface circuit described above may be disposed on the third substrate 30*b*.

For example, the photodiode and the transfer transistor described above may be disposed on the first substrate 10*b*, and the remaining pixel circuits may be disposed on the second substrate 20*b*.

In an example embodiment, the pixel load circuits according to an example embodiment may be disposed on the second substrate 20*b* or the third substrate 30*b*.

An arrangement of pixel circuits on the first substrate 10*b* and the second substrate 20*b* is not limited thereto.

The first substrate 10*b* and the second substrate 20*b* may be electrically connected to each other.

In an example embodiment, the first substrate 10*b* and the second substrate 20*b* may transmit a pixel signal or a control signal through a through-silicon via (TSV) disposed in a peripheral region of each of the first, second, and third substrates 10*b*, 20*b*, and 30*b*.

In an example embodiment, the first portion of pixel circuit PUb_1 of pixel circuits of the first substrate 10*b* and the second portion of pixel circuit PUb_2 of pixel circuits of the second substrate 20*b* may also be electrically connected through a first inter-substrate connection structure INTC_1. The first inter-substrate connection structure INTC_1 may be a copper-to-copper (C2C) bonding contact or a deep-contact structure. The deep-contact structure may include a through-silicon via. The first inter-substrate connection structure INTC_1 may electrically connect a first in-pixel contact IN_CT1, which is electrically connected to an element of the first portion of pixel circuit PUb_1 of the pixel circuits, and a second in-pixel contact IN_CT2 which is electrically connected to an element of the third portion of pixel circuit Pub_3 of the pixel circuits.

In an example embodiment, the first substrate 10*b* and/or the second substrate 20*b* may be electrically connected to the third substrate 30*b* through the through-silicon via (TSV) and/or a second inter-substrate connection structure INTC_2. A signal of the first substrate 10*b* and/or the second substrate 20*b* may be transmitted to the readout circuit or the image processor of the third substrate 30*b* through the through-silicon vias (TSV) and/or the second inter-substrate connection structure INTC_2.

In an example embodiment, the second portion of pixel circuit PUb_2 of the pixel circuits may be electrically connected to circuits of the third substrate 30*b* through a copper-to-copper (C2C) bonding contact. The second inter-substrate connection structure INTC_2 may include a C2C bonding contact.

In an example embodiment, the third portion of pixel circuit PUb_3 of the pixel circuits may be electrically connected to the circuits of the third substrate 30*b* through a through-silicon copper (TSC) (not shown).

Figure 14:
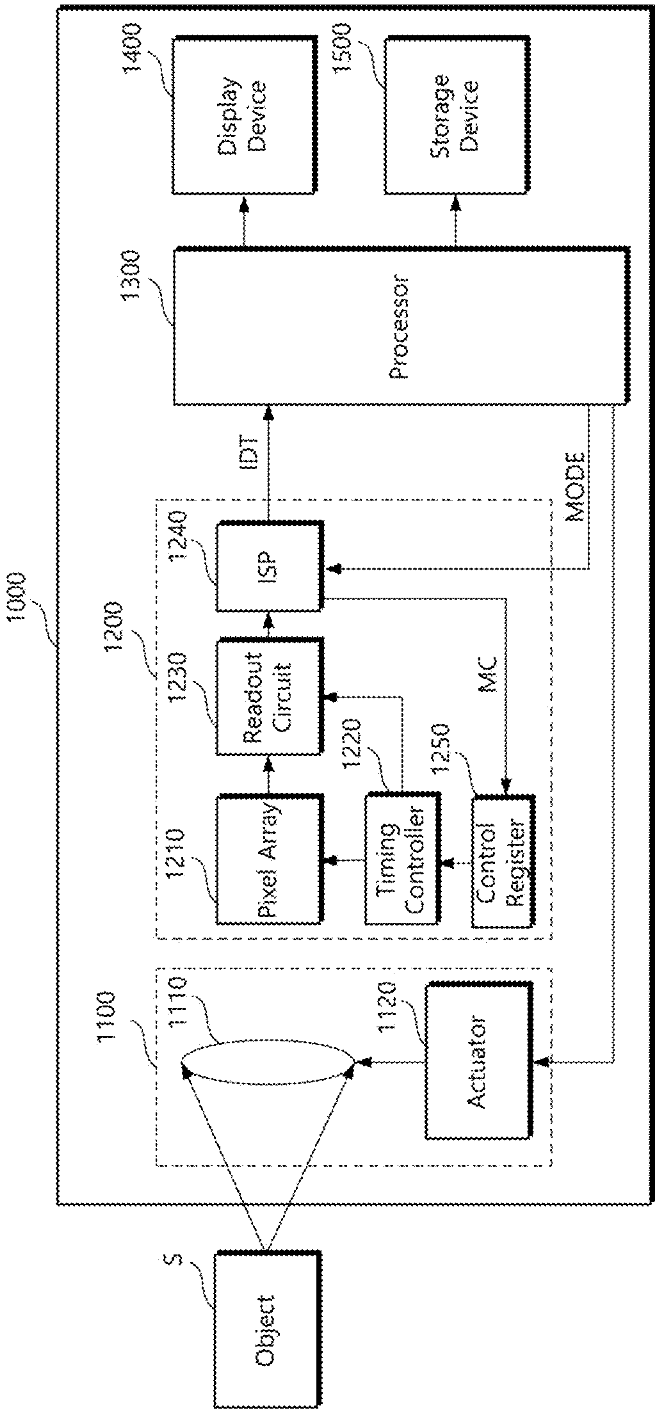
FIG. 14 is a block diagram of an electronic device according to an example embodiment.

FIG. 14 is a block diagram of an electronic device 1000 according to an example embodiment. Detailed descriptions that overlap or are similar to the previous descriptions will be omitted to avoid unnecessary repetition.

The electronic device 1000 may include an imaging unit 1100, an image sensor 1200, a processor 1300, a display device 1400, and a storage device 1500.

The processor 1300 may control the overall operation of the electronic device 1000. The processor 1300 may provide a control signal to an actuator 1120 to control a position of a lens 1110. As a result, a focal length may be controlled.

The imaging unit 1100 is a light-receiving element and may include the lens 1110 and the actuator 1120. The lens 1110 may include a plurality of lenses.

The actuator 1120 may move the lens 1110 in a direction in which a distance from an object S increases or decreases based on the control signal of the processor 1300.

The image sensor 1200 may generate an image signal and/or phase data based on incident light. The image sensor 1200 may include a pixel array 1210, a timing controller 1220, a readout circuit 1230, and an image signal processor 1240. In an example embodiment, the image sensor 1200 may be one of the image sensor 100 of FIG. 1, the image sensor 100A of FIG. 4, the image sensor 1A of FIG. 12, and the image sensor 1B of FIG. 13.

The pixel units of the pixel array 1210 may include at least one photoelectric conversion element.

The image signal processor 1240 may generate a mode control signal MC based on a capturing mode signal MODE transmitted from the processor 1300. The pixel units may operate in output mode for each subpixel RX or output mode for each pixel unit PU, based on the mode control signal MC transmitted from the image signal processor 1240.

The image signal processor 1240 according to an example embodiment may generate the mode control signal MC operating a pixel array at a full-frame rate or a frame rate lower than the full-frame rate, based on the capturing mode signal MODE transmitted from the processor 1300.

The image signal processor 1240 according to an example embodiment may operate pixel gain control based on the capturing mode signal MODE transmitted from the processor 1300.

The image signal processor 1240 may provide the mode control signal MC to a control register 1250. The timing controller 1220 may control the operation of the pixel array 1210 based on the control signal of the control register 1250.

As set forth above, an image sensor according to example embodiments may reduce power consumption by controlling a pixel load circuit connected to output lines, allowing a small magnitude of current to flow only through non-driven output lines among output lines connected to pixel units.

Also, the image sensor according to example embodiments does not require an additional bias circuit supplying a small amount of bias voltage to the non-driven output lines among the output lines connected to the pixel units. As a result, the complexity and area of a circuit layout may be reduced. In addition, the complexity and area of interconnections for supplying the bias voltage may be reduced.

While example embodiments have been shown and described above, it will be apparent to those skilled in the art that modifications and variations could be made without departing from the scope of the present invention as defined by the appended claims.

What is claimed is:

1. An image sensor comprising:

a pixel array including a plurality of pixels arranged in rows and columns, the plurality of pixels configured to output pixel signals to output lines;

pixel load circuits; and switch circuits connecting the pixel load circuits to the output lines, wherein the pixel load circuits are connected to the output lines through the switch circuits, and each of the pixel load circuits includes:

a first transistor and a second transistor connected in series; and a first control switch connecting a first node between the first transistor and the second transistor to a ground node, wherein a first aspect ratio of the first transistor and a second aspect ratio of the second transistor are different from each other, and wherein a first gate node of the first transistor and a second gate node of the second transistor are connected to the same node.

2. The image sensor of claim 1, wherein the pixel array includes a plurality of pixel groups, and wherein each of the plurality of pixel groups includes:

a plurality of pixels arranged in an m×n matrix, each of m and n being a positive integer greater than or equal to 2, and configured to receive light passing through color filters of the same color, or a plurality of pixels having a Bayer color pattern.

3. The image sensor of claim 1, wherein the second aspect ratio is smaller than the first aspect ratio.

4. The image sensor of claim 1, wherein the first gate node of the first transistor and the second gate node of the second transistor of each of the pixel load circuits are configured to receive the same bias voltage as each other.

5. The image sensor of claim 1, wherein the first gate node of the first transistor of each of the pixel load circuits is configured to receive the same magnitude of a bias voltage.

6. The image sensor of claim 1, wherein:

the output lines includes a first output line and a second output line, the first output line and the second output line are electrically connected to different pixels among the plurality of pixels, and are disposed adjacent to each other in a first direction parallel to the rows, the pixel load circuits include a first pixel load circuit and a second pixel load circuit disposed adjacent to each other in the first direction, and the first pixel load circuit and the second pixel load circuit are configured to receive the same magnitude of a bias voltage.

7. The image sensor of claim 6, wherein:

both the first control switch of the first pixel load circuit and the first control switch of the second pixel load circuit are in an ON state in a first mode, the first control switch of the first pixel load circuit is in an ON state and the first control switch of the second pixel load circuit is in an OFF state in a second mode, and a first frame rate of the first mode and a second frame rate of the second mode are different from each other.

8. The image sensor of claim 1, wherein a switch circuit of the switch circuits connects an output line, from which the pixel signal is output, among the output lines, to a pixel load circuit having the first control switch turned on, among the pixel load circuits.

9. The image sensor of claim 8, wherein a switch circuit of the switch circuits connects an output line, from which the pixel signal is not output, among the output lines, to a pixel load circuit having the first control switch turned off, among the pixel load circuits.

10. The image sensor of claim 1, wherein the pixel load circuits includes a first pixel load circuit and a second pixel load circuit, and wherein the first control switches of the first and second pixel load circuits are controlled to have different operating states.

11. The image sensor of claim 10, wherein magnitudes of currents flowing through the first pixel load circuit and the second pixel load circuit are different from each other.

12. The image sensor of claim 11, wherein the magnitude of the current flowing through the first pixel load circuit is greater than the magnitude of the current flowing through the second pixel load circuit when the first control switch of the first pixel load circuit is in an ON state and the first control switch of the second pixel load circuit is in an OFF state.

13. The image sensor of claim 1, further comprising:

a third transistor connected in series to the second transistor and having a gate node connected to the same node as the first gate node of the first transistor and the second gate node of the second transistor; and a second control switch connecting a second node between the second transistor and the third transistor to the ground node.

14. The image sensor of claim 13, wherein:

the third transistor has a third aspect ratio, an aspect ratio based on the first transistor is larger than an aspect ratio based on the first transistor and the second transistor, and an aspect ratio based on the first transistor and the second transistor is larger than an aspect ratio based on the first transistor, the second transistor, and the third transistor.

15. The image sensor of claim 1, further comprising:

bias circuits configured to provide a bias voltage to each of the pixel load circuits, wherein a current flowing through each of the pixel load circuits is mirrored from a current flowing through a bias circuit corresponding to each of the pixel load circuits.

16. The image sensor of claim 15, wherein the same magnitude of current flows through a bias circuit corresponding to each of the pixel load circuits.

17. The image sensor of claim 15, wherein each of the bias circuits includes a first switch, symmetrical to the first control switch, and wherein the first control switches of at least a portion of the pixel load circuits are controlled to have an operating state, different from an operating state of the first switches of the bias circuits.

18. An image sensor comprising:

a plurality of output lines extending in a first direction;

a plurality of pixels configured to output pixel signals to the plurality of output lines;

a plurality of pixel load circuits;

a switch circuit connecting one of the plurality of pixel load circuits to one of the plurality of output lines; and a plurality of bias circuits configured to supply a bias voltage to each of the plurality of pixel load circuits, wherein:

each of the plurality of pixel load circuits includes a plurality of transistors connected in series and a control switch connecting a first node between a first transistor and a second transistor, among the plurality of transistors, to a ground node, gate nodes of the first transistor and the second transistor are connected to the same node, and aspect ratios of the first transistor and the second transistor are different from each other, and each of the plurality of bias circuits configured to output the bias voltage of the same magnitude.

19. The image sensor of claim 18, wherein:

the plurality of pixel load circuits includes a first pixel load circuit and a second pixel load circuit, control switches of the first pixel load circuit and the second pixel load circuit have different operating states at the same time period, and gate nodes of the first transistors of the first pixel load circuit and the second pixel load circuit receive the bias voltage of the same magnitude.

20. An image sensor comprising:

a plurality of output lines extending in a first direction;

a plurality of pixels configured to output pixel signals to the plurality of output lines;

a plurality of pixel load circuits; and a plurality of switch circuits each connecting one of the plurality of pixel load circuits to one of the plurality of output lines, wherein:

each of the plurality of pixel load circuits includes a plurality of transistors connected in series and a control switch connecting a first node between a first transistor and a second transistor, among the plurality of transistors, to a ground node, gate nodes of the first transistor and the second transistor are connected to the same node, and aspect ratios of the first transistor and the second transistor are different from each other, and the plurality of pixel load circuits include:

a first pixel load circuit electrically connected to a driven output line, among the plurality of output lines, through a first switch circuit among the plurality of switch circuits, a second pixel load circuit electrically connected to a non-driven output line, among the plurality of output lines, through a second switch circuit, and the control switches of the first pixel load circuit and the second pixel load circuit have different operating states from each other.

* * * * *